(12) United States Patent
Ohsugi

(10) Patent No.: US 11,671,049 B2
(45) Date of Patent: Jun. 6, 2023

(54) SYSTEM FOR EXCITING IRON CORE IN ELECTRIC DEVICE, METHOD FOR EXCITING IRON CORE IN ELECTRIC DEVICE, PROGRAM, AND MODULATION OPERATION-SETTING DEVICE FOR INVERTER POWER SUPPLY

(71) Applicant: NIPPON STEEL CORPORATION, Tokyo (JP)

(72) Inventor: Yasuo Ohsugi, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 365 days.

(21) Appl. No.: 17/256,067

(22) PCT Filed: Sep. 20, 2019

(86) PCT No.: PCT/JP2019/036953
§ 371 (c)(1),
(2) Date: Dec. 24, 2020

(87) PCT Pub. No.: WO2020/059852
PCT Pub. Date: Mar. 26, 2020

(65) Prior Publication Data
US 2021/0273595 A1 Sep. 2, 2021

(30) Foreign Application Priority Data
Sep. 21, 2018 (JP) .............................. JP2018-177724

(51) Int. Cl.
*G01R 33/12* (2006.01)
*H02P 27/08* (2006.01)

(52) U.S. Cl.
CPC .......... *H02P 27/085* (2013.01); *G01R 33/123* (2013.01)

(58) Field of Classification Search
CPC .......................... H02P 27/085; G01R 33/123
See application file for complete search history.

(56) References Cited

U.S. PATENT DOCUMENTS

| 2009/0261774 A1 | 10/2009 | Yuuki et al. |
| 2018/0034399 A1 | 2/2018 | Bando et al. |

FOREIGN PATENT DOCUMENTS

| JP | 9-45534 A | | 2/1997 |
| JP | 2004064893 A | * | 2/2004 |
| JP | 4995518 B2 | | 8/2012 |
| JP | 2017162187 A | * | 9/2017 |

OTHER PUBLICATIONS

Krings et al., "Influence of PWM Switching Frequency and Modulation Index on the Iron Losses and Performance of Slot-less Permanent Magnet Motors," 2013 International Conference of Electrical Machines and Systems, IEEE, Oct. 26-29, 2013, pp. 474-479.

* cited by examiner

*Primary Examiner* — Cortez M Cook
(74) *Attorney, Agent, or Firm* — Birch, Stewart, Kolasch & Birch, LLP

(57) ABSTRACT

The iron loss of an iron core excited by an inverter power supply is reduced. A modulation operation-setting device 1430 for the inverter power supply controls a maximum value Hmax and a minimum value Hmin of a field intensity H in at least one minor loop such that the loss (iron loss, copper loss, and switching loss) of the entire system is less than the loss of the entire system when an electric device is operated with a target waveform (excluding harmonics).

20 Claims, 14 Drawing Sheets

FIG. 13

| MODULATION FACTOR m [−] | CARRIER FREQUENCY [kHz] | | | | | |
|---|---|---|---|---|---|---|
| | 5 | 10 | 15 | 20 | 50 | 100 |
| 0.2 | 2.32 | 2.53 | 2.61 | 3.20 | 2.59 | 1.65 |
| 0.4 | 1.54 | 1.55 | 1.56 | 1.66 | 0.72 | 0.50 |
| 0.6 | 1.28 | 1.28 | 1.28 | 1.31 | 0.92 | 0.66 |
| 0.8 | 1.15 | 1.15 | 1.06 | 1.04 | 0.94 | 0.86 |
| 1.0 | 1.07 | 1.07 | 1.02 | 1.01 | 0.98 | 0.92 |
| 1.5 | 1.01 | 1.01 | 1.01 | 1.02 | 1.02 | 1.02 |
| 2.0 | 0.99 | 0.99 | 0.99 | 1.00 | 1.00 | 1.00 |

SYSTEM FOR EXCITING IRON CORE IN ELECTRIC DEVICE, METHOD FOR EXCITING IRON CORE IN ELECTRIC DEVICE, PROGRAM, AND MODULATION OPERATION-SETTING DEVICE FOR INVERTER POWER SUPPLY

TECHNICAL FIELD

The present invention relates to a system for exciting an iron core in an electric device, a method for exciting an iron core in an electric device, a program, and a modulation operation-setting device for an inverter power supply.

The present application claims priority based on Japanese Patent Application No. 2018-177724 filed on Sep. 21, 2018, the contents of which are incorporated herein by reference.

BACKGROUND ART

For example, an inverter power supply is used as a power supply device that drives a motor of a train, a hybrid car, a home electric appliance, or the like. In addition, a reactor is used as a filter circuit of the inverter power supply. The inverter power supply is configured using a switching circuit having a plurality of switching elements. A time waveform of an excitation current output from the inverter power supply by, for example, a switching operation of the switching element is a waveform in which harmonics are superimposed on a fundamental wave. Therefore, there is a concern that the temperature of the electric device (iron core) will increase or the efficiency of the electric device will be reduced.

Therefore, Patent Document 1 discloses a reactor iron core in which the ratio of iron loss when an iron core is excited by a waveform including a harmonic component to iron loss when the iron core is excited by only a sine wave is less than 1.15.

Further, Patent Document 2 discloses a method that superimposes a current, which has the same amplitude as and an opposite phase to a harmonic component of an excitation current in a case in which a three-phase motor is driven by a PWM inverter, on the excitation current to reduce iron loss to 1.05 times the iron loss in a case in which the three-phase motor is driven by a sine-wave current.

CITATION LIST

Patent Literature

[Patent Document 1] Japanese Unexamined Patent Publication No. H09-45534
[Patent Document 2] Japanese Patent Publication No. 4995518

SUMMARY OF INVENTION

Technical Problem

However, in the technique described in Patent Document 1, it is acceptable that the iron loss when the iron core is excited by the waveform including the harmonic component be larger than the iron loss when the iron core is excited by only the sine wave. Further, in the method described in Patent Document 2, the iron loss is more than that in the case in which the three-phase motor is driven by the sine-wave current.

The invention has been made in view of the above-mentioned problems, and an object of the invention is to reduce the iron loss of an iron core excited by an inverter power supply.

Solution to Problem

According to the invention, a system for exciting an iron core in an electric device, the system including the electric device having the iron core, an inverter power supply configured to output an excitation signal including harmonics to the electric device in order to excite the iron core, and a modulation operation-setting device configured to set a modulation operation of the inverter power supply, wherein the modulation operation-setting device has a function of a setting unit configured to set the modulation operation of the inverter power supply on the basis of a relationship between a maximum value and a minimum value of a field intensity in at least one minor loop of a hysteresis loop indicating a relationship between a magnetic flux density and the field intensity of the iron core, and the relationship between the maximum value and the minimum value of the field intensity is adjusted such that an iron loss of the iron core in a case in which the iron core is excited with the excitation signal including the harmonics by the inverter power supply is less than an iron loss of the iron core in a case in which the iron core is excited with an excitation signal excluding the harmonics is provided.

According to the invention, a system for exciting an iron core in an electric device, the system including the electric device having the iron core, an inverter power supply configured to output an excitation signal including harmonics to the electric device in order to excite the iron core, and a modulation operation-setting device configured to set a modulation operation of the inverter power supply, wherein the modulation operation-setting device sets the modulation operation of the inverter power supply on the basis of a relationship between areas of closed regions formed by at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a system for exciting an iron core in an electric device, the system including the electric device having the iron core, an inverter power supply configured to output an excitation signal including harmonics to the electric device in order to excite the iron core, and a modulation operation-setting device configured to set a modulation operation of the inverter power supply, wherein the modulation operation-setting device sets the modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that, in at least a portion of a region in which the magnetic flux density increases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a system for exciting an iron core in an electric device, the system including the electric device having the iron core, an inverter power supply configured to output an excitation signal including harmonics to the electric device in order to excite the iron core, and a modulation operation-setting device configured to set a modulation operation of the inverter power supply, wherein the modulation operation-setting device sets the modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply, and a hysteresis loop of a field intensity and a magnetic flux density generated in the iron core in a case in which the iron core is excited with an excitation signal excluding the harmonics, and the relationship is adjusted such that, in at least a portion of a region in which the magnetic flux density decreases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a method for exciting an iron core in an electric device for an inverter power supply configured to output an excitation signal including harmonics to the electric device in order to excite the iron core of the electric device, the method including a setting step of setting a modulation operation of the inverter power supply on the basis of a relationship between a maximum value and a minimum value of a field intensity in at least one minor loop of a hysteresis loop indicating a relationship between a magnetic flux density and the field intensity of the iron core, wherein the relationship between the maximum value and the minimum value of the field intensity is adjusted such that an iron loss of the iron core in a case in which the iron core is excited with the excitation signal including the harmonics by the inverter power supply is less than an iron loss of the iron core in a case in which the iron core is excited with an excitation signal excluding the harmonics is provided.

According to the invention, a method for exciting an iron core in an electric device for an inverter power supply configured to output an excitation signal including harmonics to the electric device in order to excite the iron core of the electric device, the method including setting a modulation operation of the inverter power supply on the basis of a relationship between areas of closed regions formed by at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, wherein the relationship is adjusted such that an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a method for exciting an iron core in an electric device for an inverter power supply configured to output an excitation signal including harmonics to the electric device in order to excite the iron core of the electric device, the method including a setting step of setting a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, wherein the relationship is adjusted such that, in at least a portion of a region in which the magnetic flux density increases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a method for exciting an iron core in an electric device for an inverter power supply configured to output an excitation signal including harmonics to the electric device in order to excite the iron core of the electric device, the method including a setting step of setting a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, wherein the relationship is adjusted such that, in at least a portion of a region in which the magnetic flux density decreases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a program configured to cause a computer to function as each unit of the system for exciting an iron core in an electric device is provided.

According to the invention, a modulation operation-setting device for an inverter power supply configured to output an excitation signal including harmonics to an electric device in order to excite an iron core of the electric device, wherein the modulation operation-setting device for the inverter power supply sets a modulation operation of the inverter power supply on the basis of a relationship between a maximum value and a minimum value of a field intensity in at least one minor loop of a hysteresis loop indicating a relationship between a magnetic flux density and the field intensity of the iron core, and the relationship between the maximum value and the minimum value of the field intensity is adjusted such that an iron loss of the iron core in a case in which the iron core is excited with the excitation signal including the harmonics by the inverter power supply is less than an iron loss of the iron core in a case in which the iron core is excited with an excitation signal excluding the harmonics is provided.

According to the invention, a modulation operation-setting device for an inverter power supply configured to output an excitation signal including harmonics to an electric device in order to excite an iron core of the electric device, wherein the modulation operation-setting device for the inverter power supply sets a modulation operation of the inverter power supply on the basis of a relationship between areas of closed regions formed by at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a modulation operation-setting device for an inverter power supply configured to output an excitation signal including harmonics to an electric device in order to excite an iron core of the electric device, wherein the modulation operation-setting device for the inverter power supply sets a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that, in at least portion of a region in which the magnetic flux density increases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics has a larger area than a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics is provided.

According to the invention, a modulation operation-setting device for an inverter power supply configured to output an excitation signal including harmonics to an electric device in order to excite an iron core of the electric device, wherein the modulation operation-setting device for the inverter power supply sets a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that, in at least a portion of a region in which the magnetic flux density decreases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics has a larger area than a closed region fainted by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics is provided.

Advantageous Effects of Invention

According to the invention, it is possible to reduce the iron loss of the iron core excited by the inverter power supply.

BRIEF DESCRIPTION OF DRAWINGS

FIG. 13 is a diagram illustrating an example of a relationship among a carrier frequency, a modulation factor, and an iron loss ratio.

DESCRIPTION OF EMBODIMENTS

Hereinafter, an embodiment of the invention will be described with reference to the drawings.
<Outline of PWM Inverter>

In this embodiment, a case in which an inverter power supply that excites an iron core of an electric device is controlled by a pulse width modulation (PWM) method will be described as an example. This inverter is referred to as a PWM inverter. Therefore, first, the outline of the PWM inverter will be described.

Figure 1:
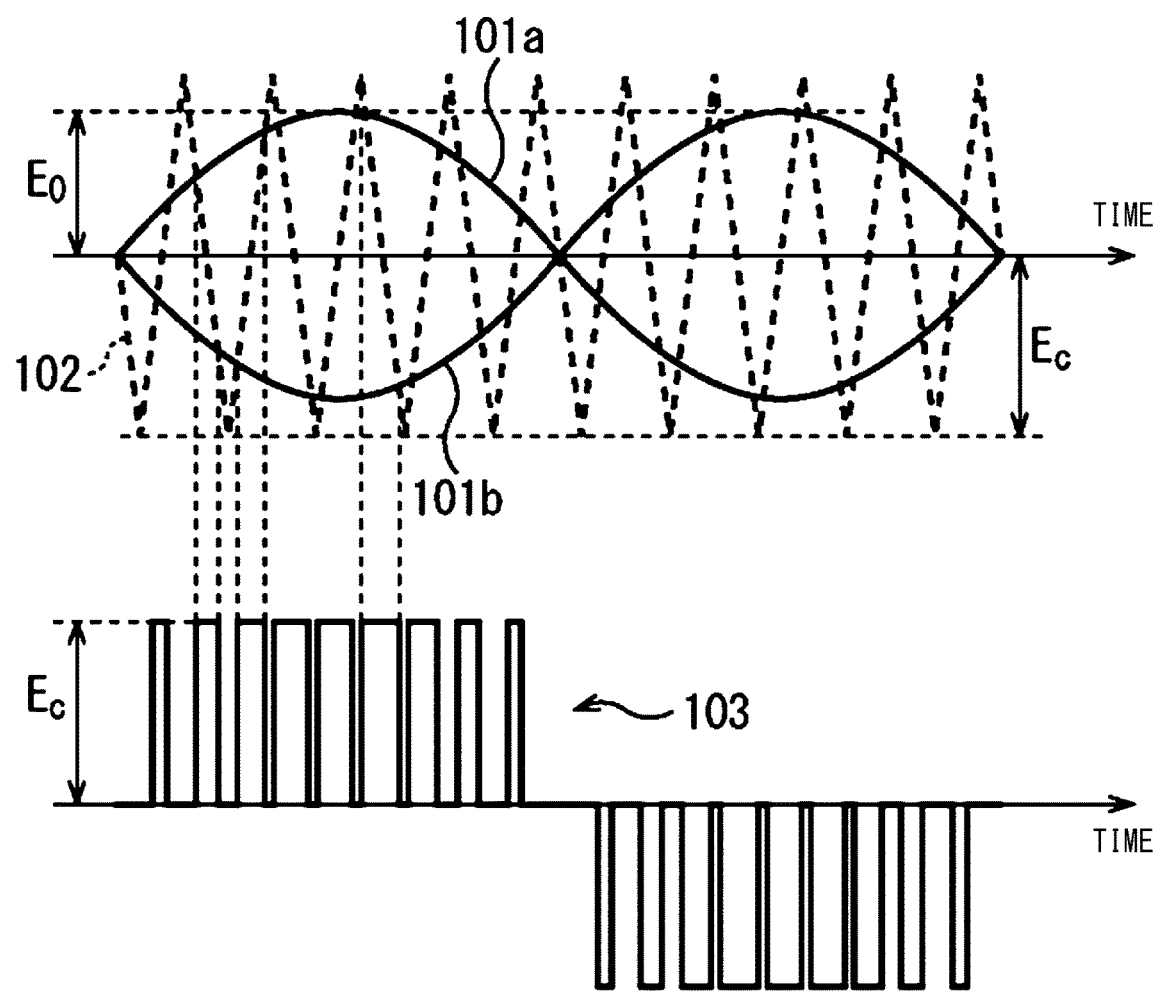
FIG. 1 is a diagram illustrating an example of an operation of a PWM inverter.

FIG. 1 is a diagram illustrating an example of the operation of the PWM inverter. FIG. 1 illustrates the time waveforms of a fundamental wave, a carrier wave (carrier), and an output voltage. In FIG. 1, an upper part illustrates the waveforms of the fundamental wave and the carrier wave and a lower part illustrates the waveform of the output voltage. Further, in FIG. 1, it is assumed that the amplitude of fundamental waves 101a and 101b is $E_0$ and the amplitude of a carrier wave 102 (and an output voltage 103) is $E_c$. The amplitude $E_0$ of the fundamental waves 101a and 101b corresponds to a crest value of a voltage applied to the electric device and the amplitude $E_c$ of the carrier wave 102 corresponds to a crest value of the output voltage of the inverter.

As illustrated in FIG. 1, the output voltage 103 of the PWM inverter is a pulse signal whose value is $E_c$ or 0 (zero) according to the magnitude relationship between the carrier wave 102 and the fundamental waves 101a and 101b. Here, a modulation factor m of the PWM inverter is represented by $E_0 \div E_c$. However, an operation method of the PWM inverter is not limited to the method illustrated in FIG. 1, and other known methods including a multi-level method may be used.
<Findings>

Next, the findings of the inventors will be described.

The iron loss W [W/kg] of an iron core is calculated from the area surrounded by a hysteresis loop of field intensity H [A/m] and magnetic flux density B [T] generated in the iron core. Specifically, the iron loss W of the iron core is calculated by the following Expression (1).

[Expression 1]

$$W = (1/\rho) \iiint_V \left( \oint H \cdot dB \right) dV \quad (1)$$

Here, ρ is density [kg/m³], f is an excitation frequency [Hz], and V is the volume [m³] of the iron core.

The inventors conceived the idea that iron loss could be reduced by reducing the area of the hysteresis loop. The field intensity H may be reduced without changing the magnitude of the magnetic flux density B in order to reduce the hysteresis loop.

Figure 2:
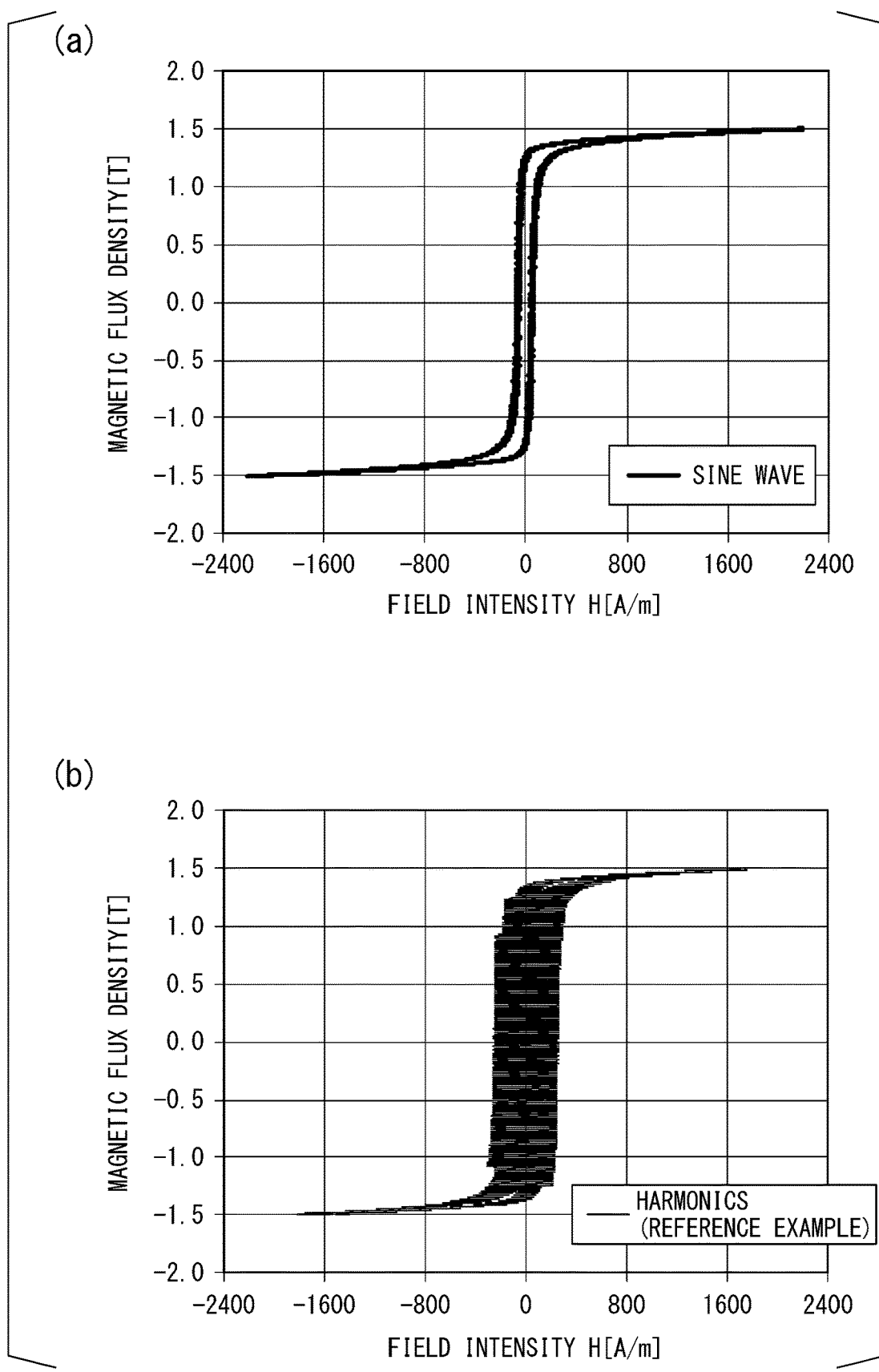
FIG. 2 is a diagram illustrating a first example of a hysteresis loop of an iron core in a case in which the iron core is excited with a sine wave and a hysteresis loop of the iron core in a case in which the iron core is excited with harmonics.
Figure 3:
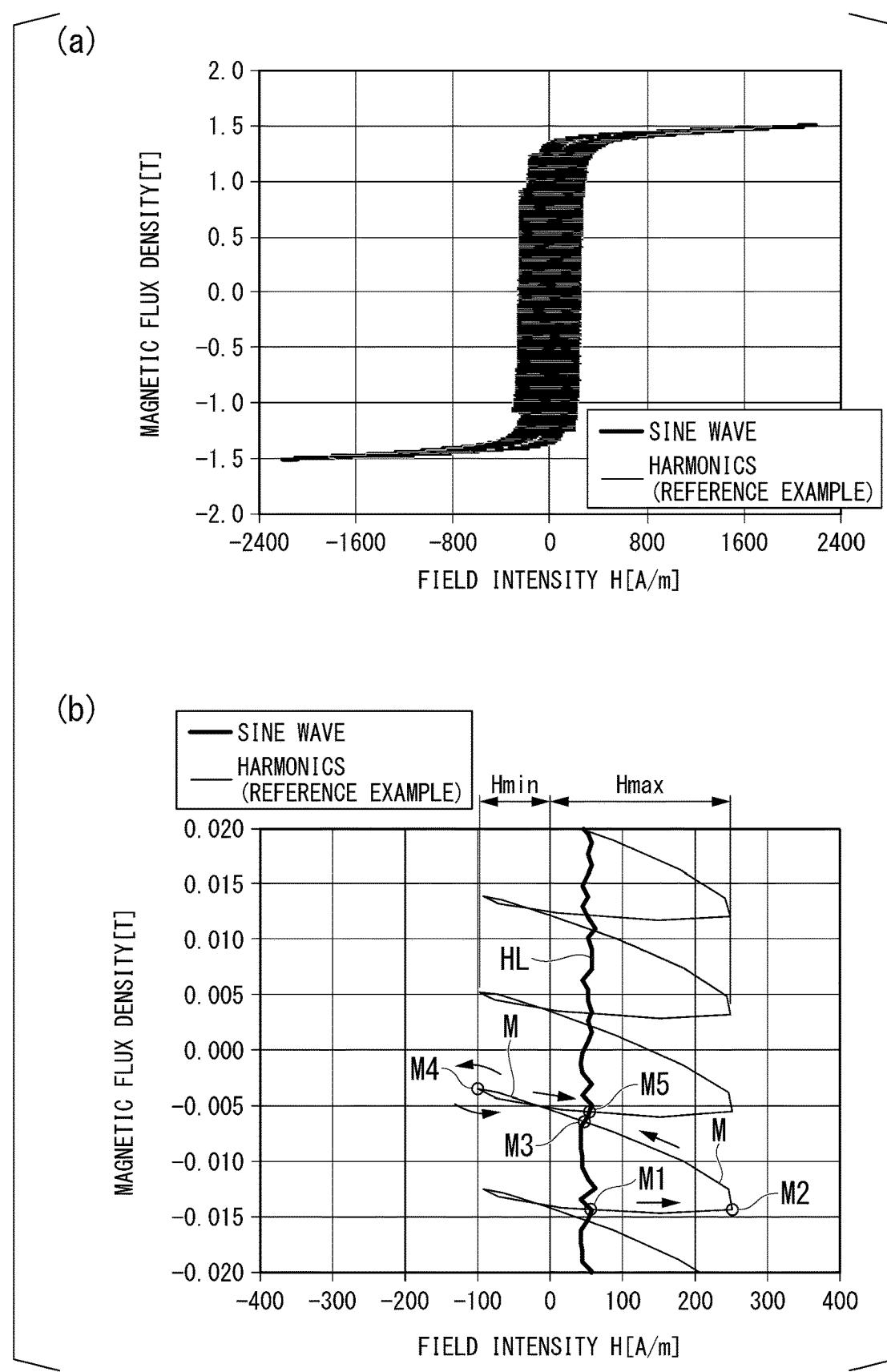
FIG. 3 is a diagram illustrating the overlap of two hysteresis loops illustrated in FIG. 2.

First, the inventors examined the hysteresis loops in cases in which the same iron core was excited with an excitation signal whose time waveform was a sine wave without including harmonics and with an excitation signal whose time waveform was a waveform in which harmonics were superimposed on the sine wave. The results are illustrated in FIGS. 2 and 3. In the following description, the sine wave whose time waveform does not include harmonics is referred to as a sine wave if necessary, and the waveform in which harmonics are superimposed on the sine wave is referred to as harmonics if necessary.

FIG. 2 is a diagram illustrating an example of a hysteresis loop of the iron core in a case in which the iron core is excited with the sine wave (FIG. 2(a)) and an example of a hysteresis loop of the iron core in a case in which the iron core is excited with the harmonics (FIG. 2(b)). FIG. 3 is a diagram illustrating the overlap of the hysteresis loop of the iron core in the case in which the iron core is excited with the sine wave illustrated in FIG. 2(a) and the hysteresis loop of the iron core in the case in which the iron core is excited with the harmonics illustrated in FIG. 2(b). FIG. 3(a) illustrates the entire hysteresis loop and FIG. 3(b) is an enlarged view illustrating a portion of FIG. 3(a). The hysteresis loop of the iron core in the case in which the iron core is excited with the harmonics has minor loops that oscillate in a short cycle as illustrated in FIG. 3(b). Here, for one minor loop in the hysteresis loop in the case in which the iron core is excited with the harmonics, the range of the minor loop is from an intersection point with the hysteresis loop in the case in which the iron core is excited with the sine wave when the minor loop changes over time in a direction in which the field intensity H increases to the next intersection point with the hysteresis loop in the case in which the iron core is excited with the sine wave when the minor loop changes over time in the direction in which the field intensity H increases similarly. Therefore, in the scales illustrated in FIGS. 2(b) and 3(a), oscillation lines (a plurality of minor loops) are so close to each other that they are not distinguishable and thus appear to be filled. FIG. 2 (and FIG. 3) illustrates the results in a case in which the modulation factor m of the PWM inverter is 0.2 and the carrier frequency (the frequency of the carrier wave) is 100 [kHz].

That is, in the example illustrated in FIG. 3(b), a portion of a hysteresis loop HL in the case in which the iron core is excited with the excitation signal excluding the harmonics is represented by "SINE WAVE", and a portion of the hysteresis loop in the case in which the iron core is excited with the excitation signal including the harmonics is represented by "HARMONICS (REFERENCE EXAMPLE)".

A plurality of minor loops are included in the hysteresis loop in the case in which the iron core is excited with the excitation signal including harmonics. One minor loop M among the plurality of minor loops included in FIG. 3(b) has a point M1 as a starting point and a point M5 as an end point.

The point M1 is an intersection point with the hysteresis loop HL in the case in which the iron core is excited with the excitation signal excluding the harmonics when the minor loop changes over time in the direction (the right direction in FIG. 3(b)) in which the field intensity H increases.

The maximum value of the field intensity H in the minor loop M corresponds to the field intensity H at a point M2 on the minor loop M.

A point M3 on the minor loop M is an intersection point with the hysteresis loop HL in the case in which the iron core is excited with the excitation signal excluding the harmonics when the minor loop changes over time in the direction (the left direction in FIG. 3(b)) in which the field intensity H decreases.

The minimum value of the field intensity H in the minor loop M corresponds to the field intensity H at a point M4 on the minor loop M.

As described above, the point M5 on the minor loop M corresponds to the end point of the minor loop M. In addition, the point M5 corresponds to a starting point of a minor loop (a minor loop located above the minor loop M in FIG. 3(b)) adjacent to the minor loop M.

The minor loop as illustrated in FIG. 3(b) occurs in the hysteresis loop of the iron core in the case in which the iron core is excited with the harmonics. In the region illustrated in FIG. 3(b), an absolute value |Hmax| of a maximum value Hmax of the field intensity H in the minor loop is greater than an absolute value |Hmin| of a minimum value Hmin of the field intensity H in the minor loop (|Hmax|>|Hmin|).

The "maximum value Hmax of the field intensity H in the minor loop" is the maximum value of the field intensity H in one minor loop.

The "minimum value Hmin of the field intensity H in the minor loop" is the minimum value of the field intensity H in one minor loop.

In the examples illustrated in FIGS. 2 and 3, the iron loss of the iron core in the case in which the iron core is excited with the sine wave and the iron loss of the iron core in the case in which the iron core is excited with the harmonics are 10.84 [W/kg] and 17.88 [W/kg], respectively.

Figure 4:
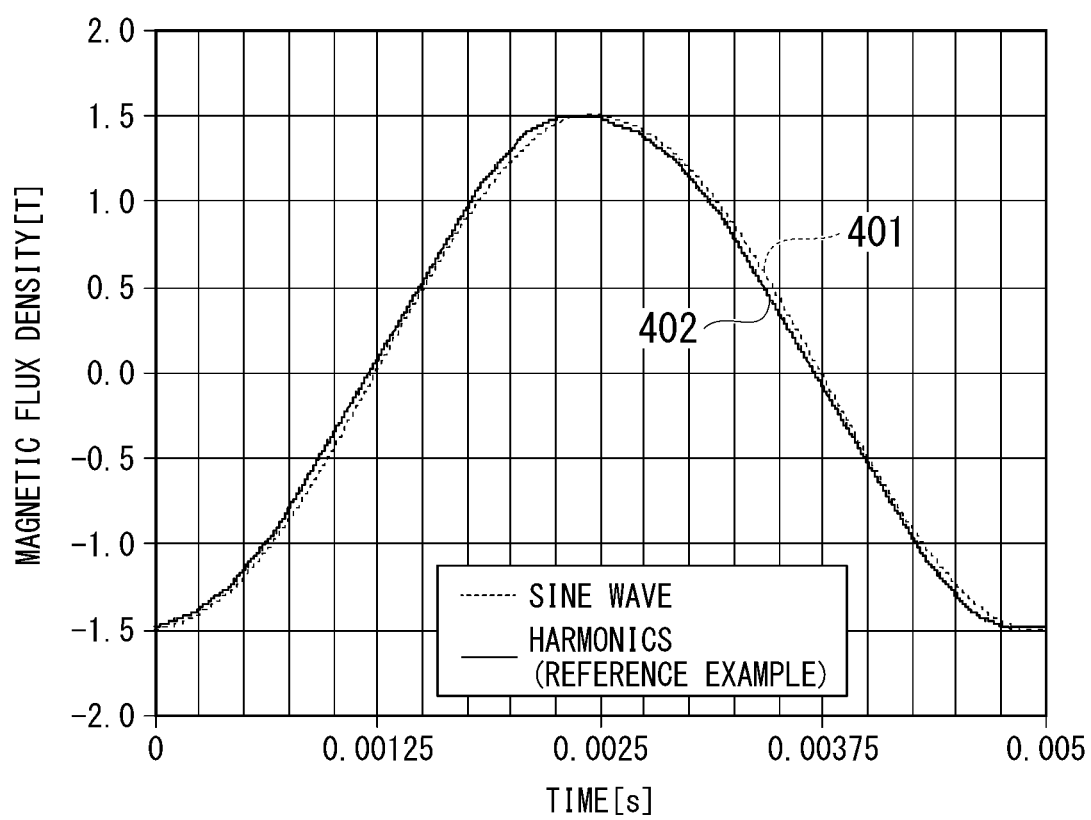
FIG. 4 is a diagram illustrating a time waveform of a magnetic flux density when the hysteresis loop illustrated in FIG. 2 is obtained.

FIG. 4 is a diagram illustrating the time waveform of the magnetic flux density B in a case in which the hysteresis loop illustrated in FIGS. 2 and 3 is obtained. The time on the horizontal axis in FIG. 4 is the time in a case in which a reference time is 0 (that is, a value on the horizontal axis in FIG. 4 is the same as the time elapsed since a time 0). This holds for FIGS. 10 and 11 which will be described below.

A form factor of a time waveform 401 of the magnetic flux density B in the case in which the iron core is excited with the sine wave and a form factor of a time waveform 402 of the magnetic flux density B in the case in which the iron core is excited with the harmonics are 1.1108 and 1.1155, respectively. The two form factors are substantially the same as the form factor of the sine wave ($=\pi/2\sqrt{2} \approx 1.1107$). Therefore, it is considered that the iron loss of the iron core in the case in which the iron core is excited with the harmonics is more than the iron loss of the iron core in the case in which the iron core is excited with the sine wave due to an increase in the field intensity H.

From the above, the inventor conceived that the relationship between the maximum value Hmax and the minimum value Hmin of the field intensity H in the minor loop was adjusted to decrease the area of the hysteresis loop and to reduce the iron loss of the iron core.

Therefore, in the region illustrated in FIG. 3(b), the modulation factor m and the carrier frequency of the PWM inverter were adjusted such that the absolute value |Hmin| of the minimum value Hmin of the field intensity H in at least some of the minor loops was greater than the absolute value |Hmax| of the maximum value Hmax of the field intensity H in the minor loops (|Hmax|<|Hmin|). The results are illustrated in FIGS. 5 to 9. FIGS. 5 to 9 illustrate a case in which the modulation factor m of the PWM inverter is 0.4 and the frequency of the carrier wave is 100 [kHz].

Figure 5:
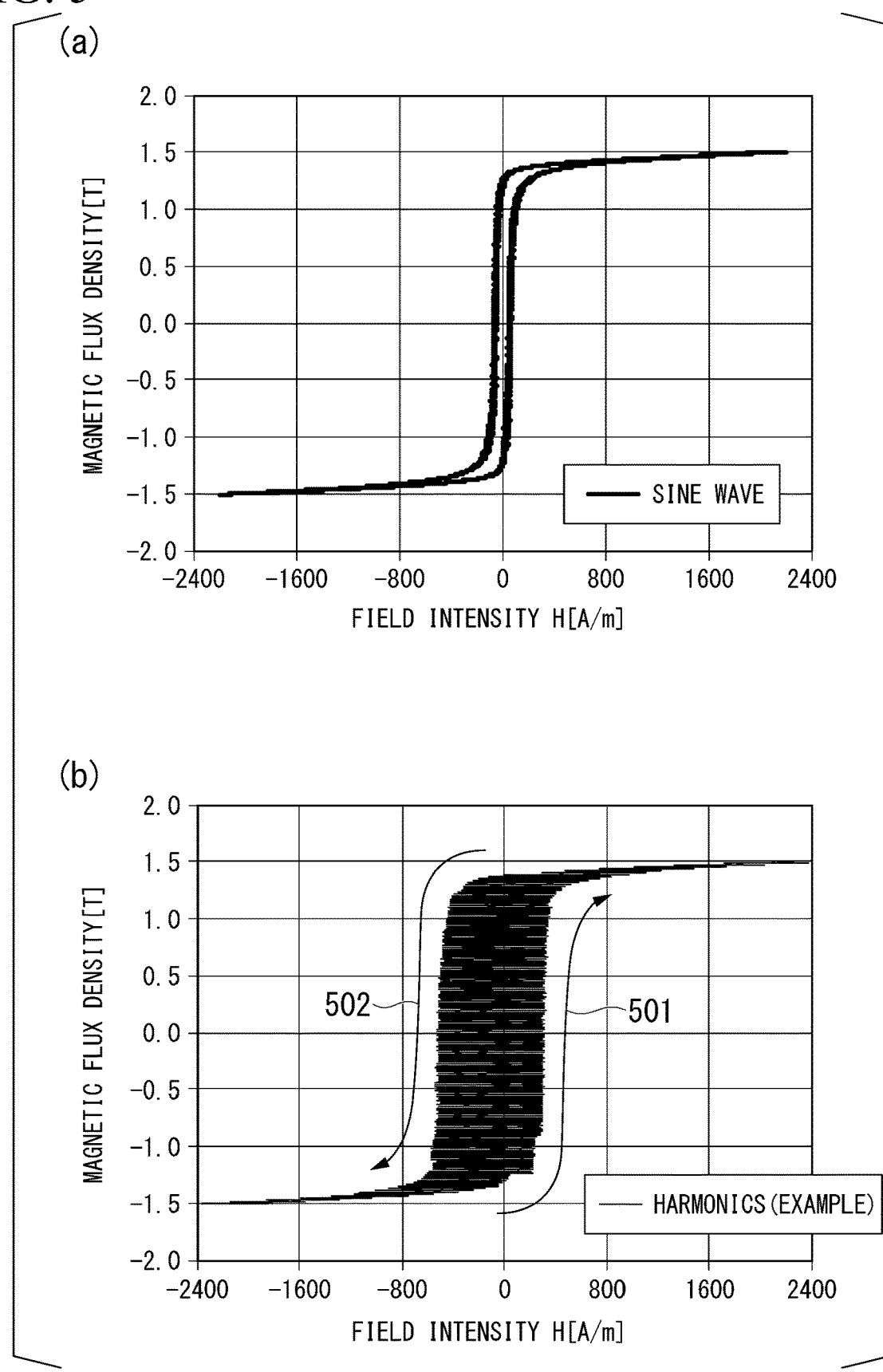
FIG. 5 is a diagram illustrating a second example of the hysteresis loop of the iron core in a case in which the iron core is excited with the sine wave and the hysteresis loop of the iron core in a case in which the iron core is excited with the harmonics.
Figure 6:
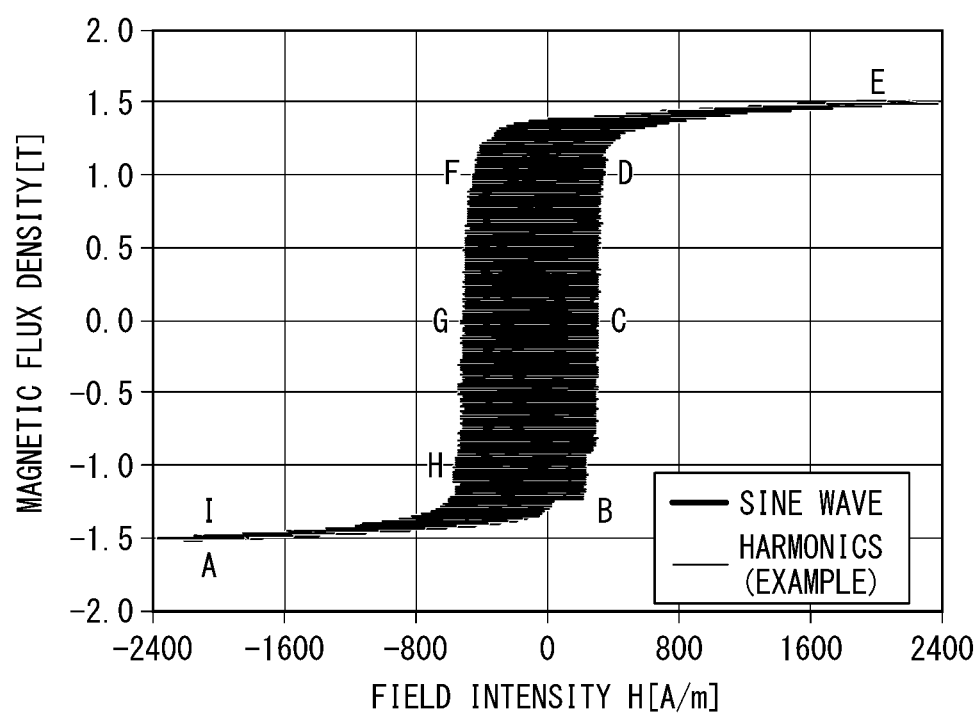
FIG. 6 is a diagram illustrating the overlap of two hysteresis loops illustrated in FIG. 5.
Figure 7:
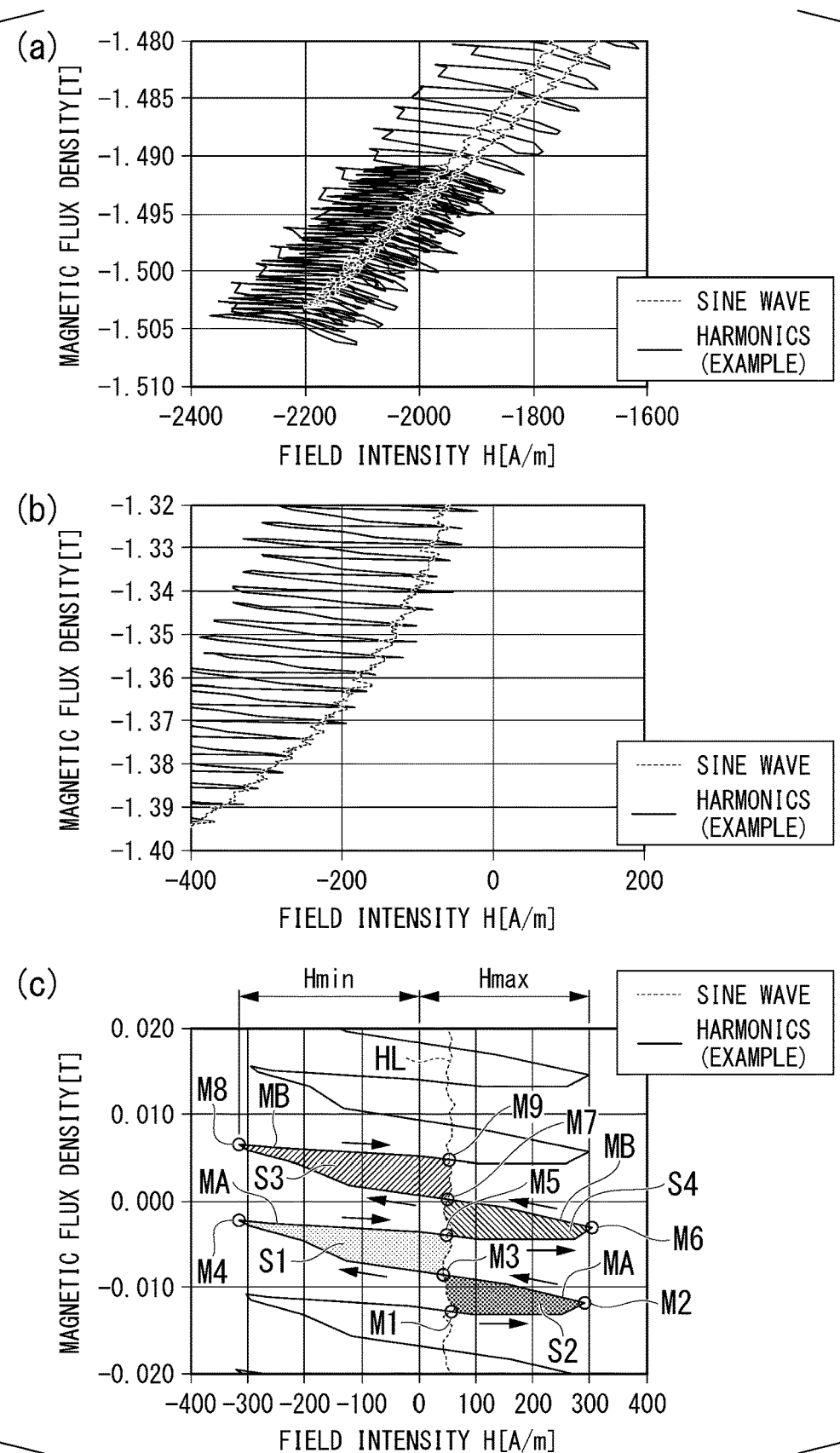
FIG. 7 is an enlarged view illustrating portions of regions A (and I), B, and C in FIG. 6.
Figure 8:
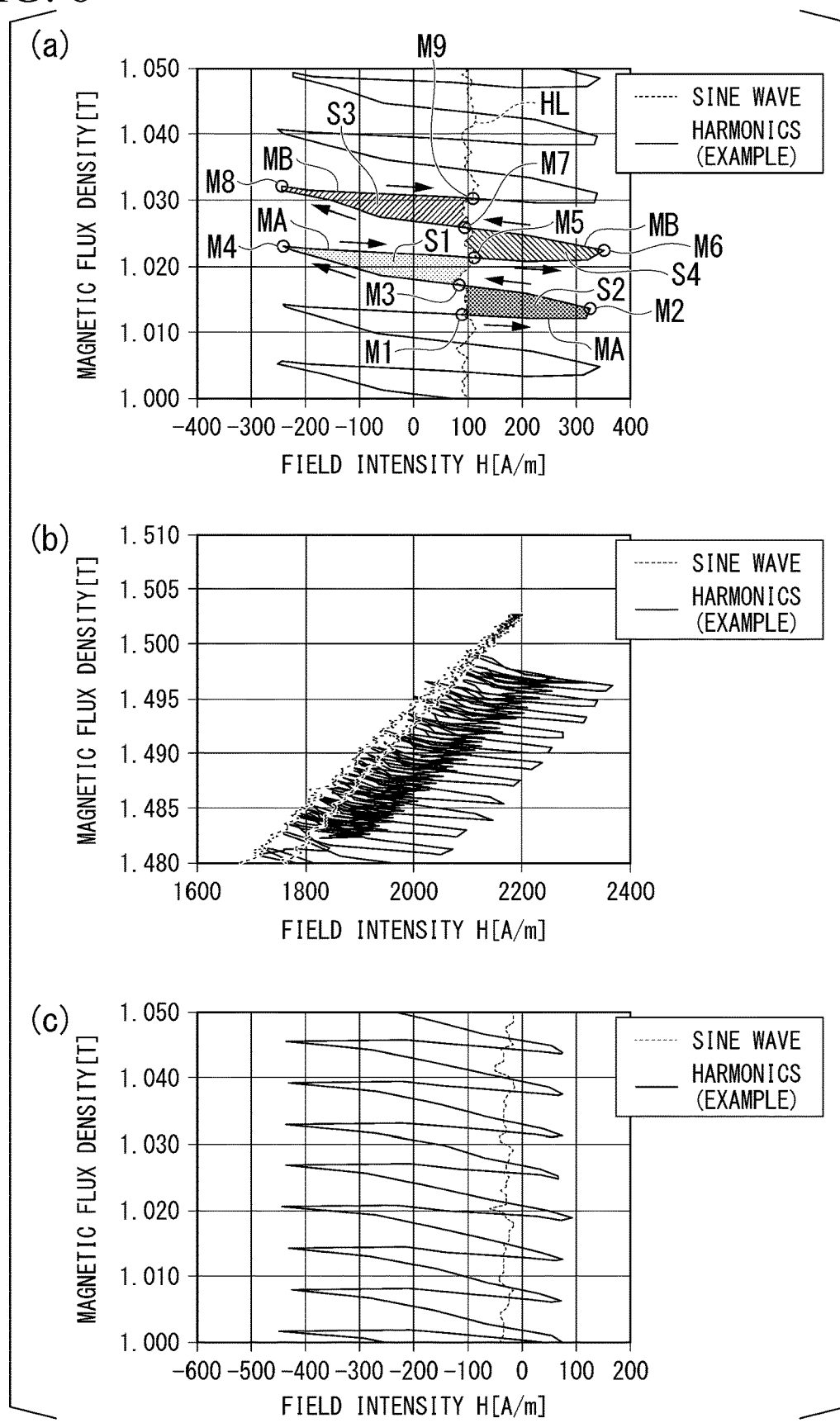
FIG. 8 is an enlarged view illustrating portions of regions D, E, and F in FIG. 6.
Figure 9:
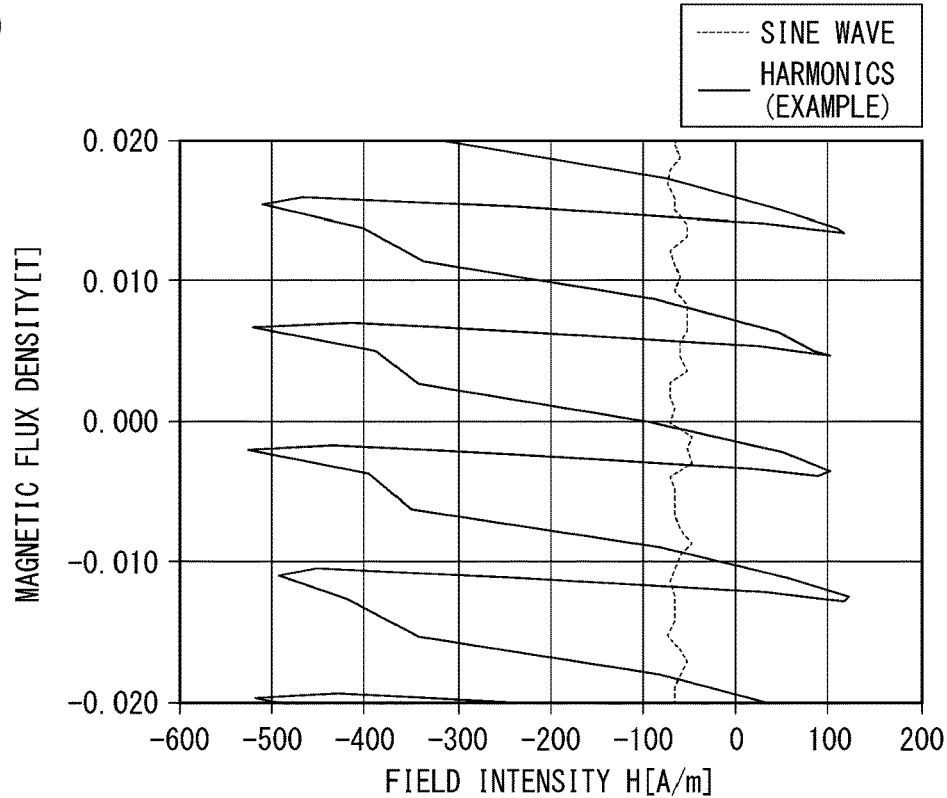
FIG. 9 is an enlarged view illustrating portions of regions G and H in FIG. 6.
Figure 9:
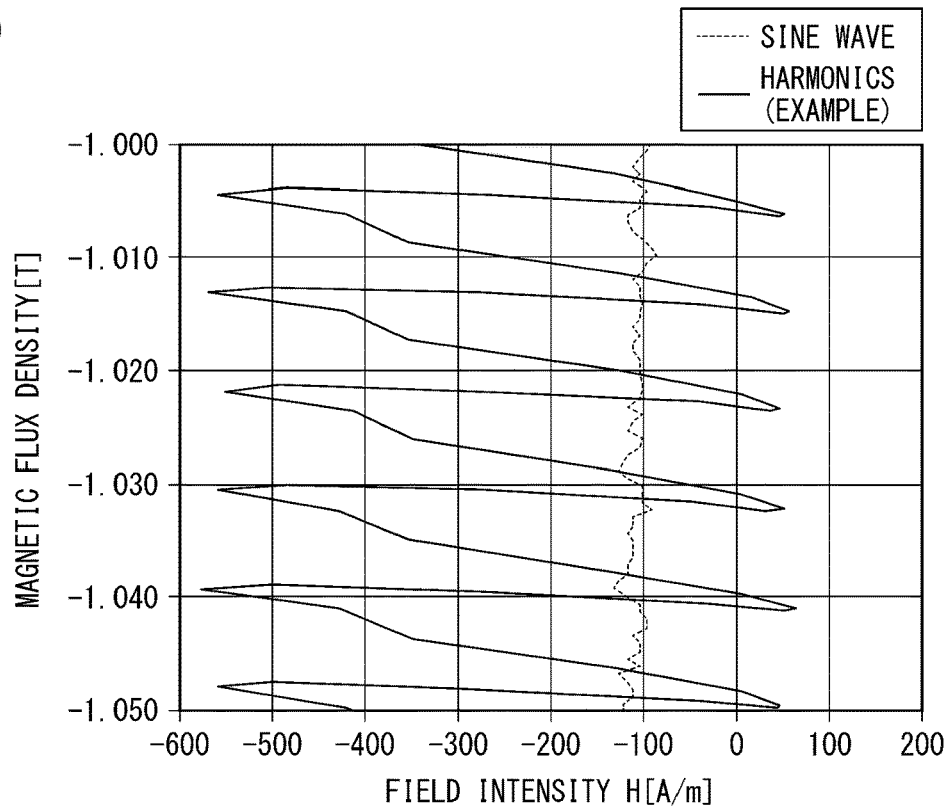

FIG. 5 is a diagram illustrating an example of the hysteresis loop of the iron core in the case in which the iron core is excited with the sine wave (FIG. 5(a)) and an example of the hysteresis loop of the iron core in the case in which the iron core is excited with the harmonics (FIG. 5(b)). FIG. 6 is a diagram illustrating the overlap of the hysteresis loop of the iron core in the case in which the iron core is excited with the sine wave illustrated in FIG. 5(a) and the hysteresis loop of the iron core in the case in which the iron core is excited with the harmonics illustrated in FIG. 5(b). FIG. 6 illustrates the entire hysteresis loop. FIGS. 7 to 9 are enlarged views illustrating a portion of FIG. 6. Specifically, FIGS. 7(a), 7(b), 7(c), 8(a), 8(b), 8(c), 9(a), and 9(b) are enlarged views illustrating regions A (and I), B, C, D, E, F, G, and H illustrated in FIG. 6, respectively.

The region illustrated in FIG. 3(b) corresponds to the region (region C) illustrated in FIG. 7(c). In a third minor loop MA (M1~M2~M3~M4~M5) from the top and a second minor loop MB (M5~M6~M7~M8~M9) from the top among three minor loops included in the region C illustrated in FIG. 7(c), the absolute value |Hmin| of the minimum value Hmin of the field intensity H is greater than the absolute value |Hmax| of the maximum value Hmax of the field intensity H.

Here, the minor loop adjusted to satisfy the relationship of |Hmin|>|Hmax| is referred to as a "first minor loop" in Claim 2. In FIG. 7(c), the third minor loop MA (M1~M2~M3~M4~M5) from the top and the second minor loop MB (M5~M6~M7~M8~M9) from the top correspond to the "first minor loop" in Claim 2.

In the region C illustrated in FIG. 7(c) (that is, the region in which the magnetic flux density increases in the hysteresis loop HL in the case in which the iron core is excited with the excitation signal excluding the harmonics), in a case in which a starting point M1 (an intersection point with the hysteresis loop HL) of the third minor loop MA (M1~M2~M3~M4~M5) from the top in FIG. 7(c) among the three minor loops included in the hysteresis loop (the hysteresis loop represented by "HARMONICS (EXAMPLE)" in FIG. 7(c)) in the case in which the iron core is excited with the excitation signal including the harmonics by the inverter power supply is a reference point, the following relationship is satisfied: the absolute value [Hmin] of a difference between the minimum value of the field intensity H in the minor loop MA (that is, the value of the field intensity H at the point M4 on the minor loop MA) and the value of the field intensity H at the reference point M1 is greater than the absolute value [Hmax] of a difference between the maximum value of the field intensity H in the minor loop MA (that is, the value of the field intensity H at the point M2 on the minor loop MA) and the value of the field intensity H at the reference point M1.

Here, the minor loop adjusted to satisfy the relationship of [Hmin]>[Hmax] is referred to as a "third minor loop" in Claim 5. The reference point (the starting point of the third minor loop) is referred to as a "first reference point" in Claim 5. In FIG. 7(c), the minor loop MA (M1~M2~M3~M4~M5) corresponds to the "third minor loop" in Claim 5, and the point M1 corresponds to the "first reference point" in Claim 5 which corresponds to the minor loop MA.

In a case in which the starting point M5 (an intersection point with the hysteresis loop HL) of the second minor loop MB (M5~M6~M7~M8~M9) from the top in FIG. 7(c) is a reference point, the following relationship is satisfied: the absolute value [Hmin] of a difference between the minimum value of the field intensity H in the minor loop MB (that is, the value of the field intensity H at the point M8 on the minor loop MB) and the value of the field intensity H at the reference point M5 is greater than the absolute value [Hmax] of a difference between the maximum value of the field intensity H in the minor loop MB (that is, the value of the field intensity H at the point M6 on the minor loop MB) and the value of the field intensity H at the reference point M5. The minor loop MB (M5~M6~M7~M8~M9) corresponds to the "third minor loop" in Claim 5, and the point M5 corresponds to the "first reference point" in Claim 5 which corresponds to the minor loop MB.

Only one minor loop or a plurality of minor loops corresponding to the "third minor loop" may be present in at least a portion of the region in which the magnetic flux density B increases in the hysteresis loop. Further, only one "first reference point" corresponding to one "third minor loop" is determined. In a case in which there are a plurality of "third minor loops", the "first reference points" corresponding to each of the "third minor loops" are present. Therefore, the number of reference points corresponding to the "first reference point" corresponds to the number of "third minor loops". Only one reference point or a plurality of reference points may be present in at least a portion of the region in which the magnetic flux density B increases in the hysteresis loop. For example, in FIG. 7(c), the point M1 is determined as the "first reference point" corresponding to the minor loop MA (third minor loop), and the point M5 is determined as the "first reference point" corresponding to the minor loop MB (third minor loop).

Further, in some cases, the relationship of |Hmin|>|Hmax| and the relationship of [Hmin]>[Hmax] are satisfied in one minor loop at the same time. In this case, the "first minor loop" and the "third minor loop" can be the same minor loop. For example, in the minor loop MA and the minor loop MB illustrated in FIG. 7(c), both the relationship of |Hmin|>|Hmax| and the relationship of [Hmin]>[Hmax] are satisfied.

Furthermore, in the example illustrated in FIG. 7(c), the following relationships are also satisfied.

In the region C illustrated in FIG. 7(c), in the third minor loop MA from the top in FIG. 7(c) among the three minor loops included in the hysteresis loop (the hysteresis loop represented by "HARMONICS (EXAMPLE)" in FIG. 7(c)) in the case in which the iron core is excited with the excitation signal including the harmonics by the inverter power supply, the area S1 of a closed region M3~M4~M5~M3 formed by a portion that is located on the side (the left side of FIG. 7(c)) where the field intensity is low with respect to the hysteresis loop HL (the hysteresis loop represented by "SINE WAVE" in FIG. 7(c)) in a case in which the iron core is excited with a sine-wave excitation signal without including harmonics and the hysteresis loop HL is larger than the area S2 of a closed region M1~M2~M3~M1 formed by a portion that is located on the side (the right side of FIG. 7(c)) where the field intensity is high with respect to the hysteresis loop HL (the hysteresis loop represented by "SINE WAVE" in FIG. 7(c)) and the hysteresis loop HL.

In addition, in the second minor loop MB from the top in FIG. 7(c) among the three minor loops included in the region C illustrated in FIG. 7(c), the area S3 of a closed region M7~M8~M9~M7 formed by a portion that is located on the side (the left side of FIG. 7(c)) where the field intensity is low with respect to the hysteresis loop HL (the hysteresis loop represented by "SINE WAVE" in FIG. 7(c)) in the case in which the iron core is excited with the sine-wave excitation signal without including harmonics and the hysteresis loop HL is larger than the area S4 of a closed region M5~M6~M7~M5 formed by a portion that is located on the side (the right side of FIG. 7(c)) where the field intensity is high with respect to the hysteresis loop HL (the hysteresis loop represented by "SINE WAVE" in FIG. 7(c)) and the hysteresis loop HL.

Further, in the region D illustrated in FIG. 8(a) (that is, the region in which the magnetic flux density increases in the hysteresis loop HL in the case in which the iron core is excited with the excitation signal excluding the harmonics), in a case in which a starting point M1 (an intersection point with the hysteresis loop HL) of a second minor loop MA (M1~M2~M3~M4~M5) from the bottom in FIG. 8(a) among a plurality of minor loops included in the hysteresis loop (the hysteresis loop represented by "HARMONICS (EXAMPLE)" in FIG. 8(a)) in the case in which the iron core is excited with the excitation signal including the harmonics by the inverter power supply is a reference point, the following relationship is satisfied: the absolute value [Hmin] of a difference between the minimum value of the field intensity H in the minor loop MA (that is, the value of the field intensity H at the point M4 on the minor loop MA) and the value of the field intensity H at the reference point M1 is greater than the absolute value [Hmax] of a difference between the maximum value of the field intensity H in the minor loop MA (that is, the value of the field intensity H at the point M2 on the minor loop MA) and the value of the field intensity H at the reference point M1. Here, the minor loop MA (M1~M2~M3~M4~M5) corresponds to the "third minor loop" in Claim 5, and the point M1 corresponds to the "first reference point" in Claim 5 corresponding to the minor loop MA.

In a case in which the starting point M5 (an intersection point with the hysteresis loop HL) of a third minor loop MB (M5~M6~M7~M8~M9) from the bottom in FIG. 8(A) is a reference point, the following relationship is satisfied: the absolute value [Hmin] of a difference between the minimum value of the field intensity H in the minor loop MB (that is, the value of the field intensity H at the point M8 on the minor loop MB) and the value of the field intensity H at the reference point M5 is greater than the absolute value [Hmax] of a difference between the maximum value of the field intensity H in the minor loop MB (that is, the value of the field intensity H at the point M6 on the minor loop MB) and the value of the field intensity H at the reference point M5. The minor loop MB (M5~M6~M7~M8~M9) corresponds to the "third minor loop" in Claim 5, and the point M5 corresponds to the "first reference point" in Claim 5 which corresponds to the minor loop MB.

In the examples illustrated in FIGS. 7(c) and 8(a), a plurality of minor loops corresponding to the "first minor loop" are present in the region in which the magnetic flux density B increases in the hysteresis loop. However, even in a case in which only one minor loop corresponding to the "first minor loop" is present in the region in which the magnetic flux density B increases in the hysteresis loop, it is possible to reduce the iron loss of the iron core.

In the examples illustrated in FIGS. 7(c) and 8(a), a plurality of minor loops corresponding to the "third minor loop" are present in the region in which the magnetic flux density B increases in the hysteresis loop, and a plurality of points corresponding to the "first reference point" are present in the region in which the magnetic flux density B increases in the hysteresis loop. However, even in a case in which only one minor loop corresponding to the "third minor loop" is present in the region in which the magnetic flux density B increases in the hysteresis loop, it is possible to reduce the iron loss of the iron core. In this case, only one point corresponding to the "first reference point" is present in the region in which the magnetic flux density B increases in the hysteresis loop.

Further, in the example illustrated in FIG. 8(a), the following relationships are also satisfied.

In the region D illustrated in FIG. 8(a), for example, in the second minor loop MA from the bottom in FIG. 8(a) among a plurality of minor loops included in the hysteresis loop (the hysteresis loop represented by "HARMONICS (EXAMPLE)" in FIG. 8(a)) in the case in which the iron core is excited with the excitation signal including the harmonics by the inverter power supply, the area S1 of a closed region M3~M4~M5~M3 formed by a portion that is located on the side (the left side of FIG. 8(a)) where the field intensity is low with respect to the hysteresis loop HL (the hysteresis loop represented by "SINE WAVE" in FIG. 8(a)) in a case in which the iron core is excited with the sine-wave excitation signal without including harmonics and the hysteresis loop HL is larger than the area S2 of a closed region M1~M2~M3~M1 formed by a portion that is located on the side (the right side of FIG. 8(a)) where the field intensity is high with respect to the hysteresis loop HL (the hysteresis loop represented by "SINE WAVE" in FIG. 8(a)) and the hysteresis loop HL.

In addition, in the third minor loop MB from the bottom in FIG. 8(a) among the plurality of minor loops included in the region D illustrated in FIG. 8(a), the area S3 of a closed region M7~M8~M9~M7 formed by a portion that is located on the side (the left side of FIG. 8(a)) where the field intensity is low with respect to the hysteresis loop HL (the hysteresis loop represented by "SINE WAVE" in FIG. 8(a)) in a case in which the iron core is excited with the sine-wave excitation signal without including harmonics and the hysteresis loop HL is larger than the area S4 of a closed region M5~M6~M7~M5 formed by a portion that is located on the side (the right side of FIG. 8(a)) where the field intensity is high with respect to the hysteresis loop HL (the hysteresis loop represented by "SINE WAVE" in FIG. 8(a)) and the hysteresis loop HL.

In the examples illustrated in FIGS. 5 to 9 in which the above-mentioned adjustment has been performed, the iron loss of the iron core in a case in which the iron core was excited with the sine wave and the iron loss of the iron core in a case in which the iron core was excited with the harmonics were 10.84 [W/kg] and 5.47 [W/kg], respectively. As can be seen from the above, the iron loss of the iron core in a case in which the iron core is excited with the harmonics can be less than the iron loss of the iron core in a case in which the iron core is excited with the sine wave by adjusting the relationship between the maximum value Hmax and the minimum value Hmin of the field intensity H in the minor loop, by adjusting the relationship between the absolute value [Hmin] of the difference between the minimum value of the field intensity H in the minor loop included in the hysteresis loop represented by "HARMONICS (EXAMPLE)" in FIG. 7(c) and the like and the value of the field intensity at the reference point M1 and the absolute value [Hmax] of the difference between the maximum value of the field intensity H in the minor loop and the value of the field intensity at the reference point M1, or by adjusting the relationship between the areas S1 and S3 of the portions, which are located outside the hysteresis loop represented by "SINE WAVE" in FIG. 7(c) and the like, and the areas S2 and S4 of the portions which are located inside the hysteresis loop in the minor loops included in the hysteresis loop represented by "HARMONICS (EXAMPLE)" in FIG. 7(c) and the like.

Figure 10:
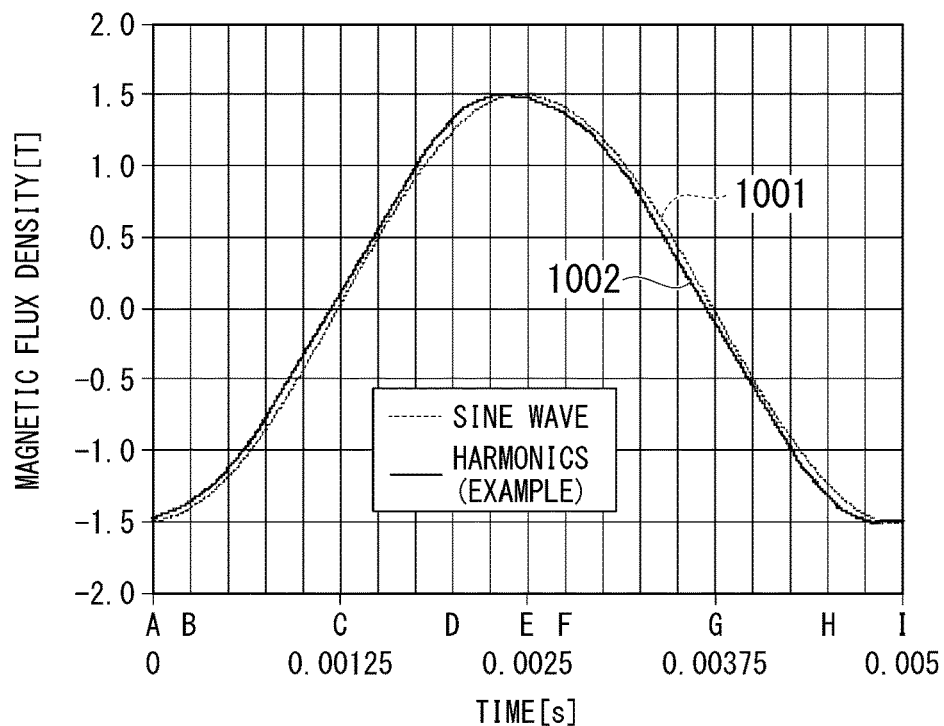
FIG. 10 is a diagram illustrating a time waveform of a magnetic flux density when the hysteresis loop illustrated in FIG. 5 is obtained.

FIG. 10 is a diagram illustrating the time waveform of the magnetic flux density B in a case in which the hysteresis loop illustrated in FIGS. 5 to 9 is obtained. Times A to I illustrated in FIG. 10 correspond to the regions A to I illustrated in FIG. 6, respectively (for example, changes in the magnetic flux density B and the field intensity H in the vicinity of the time A illustrated in FIG. 10 are as in the region A illustrated in FIG. 6 (as in FIG. 7(a))).

The form factor of a time waveform 1001 of the magnetic flux density B in a case in which the iron core is excited with the sine wave and the form factor of a time waveform 1002 of the magnetic flux density B in a case in which the iron core is excited with the harmonics are 1.1108 and 1.1154, respectively, which are substantially equal to each other. Therefore, as can be seen from the above, it is possible to reduce the field intensity H, without significantly changing the effective value (that is, magnetic energy) of the magnetic flux density in the iron core, by adjusting the relationship between the maximum value Hmax and the minimum value Hmin of the field intensity H in the minor loop. As a result, the iron loss of the iron core can be less than that in the case in which the iron core is excited with the sine wave.

Figure 11:
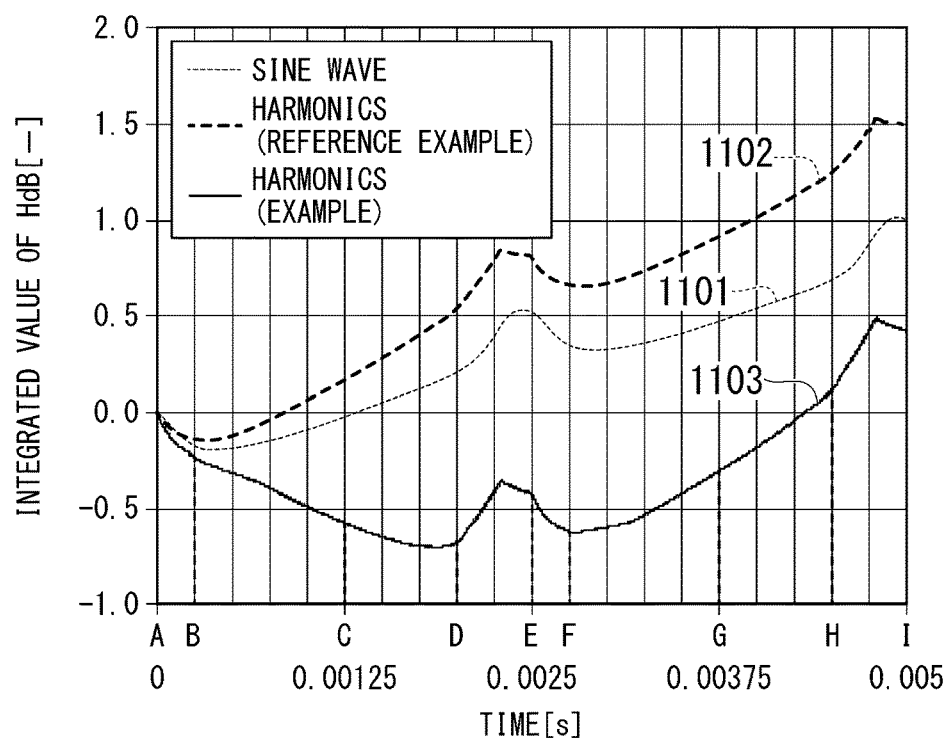
FIG. 11 is a diagram illustrating a change in an integrated value of a very small area HdB over time in the hysteresis loop illustrated in FIGS. 2 and 5 to 9.

FIG. 11 is a diagram illustrating a change in the integrated value of a very small area HdB in the hysteresis loop illustrated in FIG. 2 and FIGS. 5 to 9 over time. The very small area HdB is the product of the value of the field intensity H and the amount of change dB in the magnetic flux density B per unit time. However, in FIG. 11, the integrated value of HdB is a relative value in a case in which the value at the time I (=0.005 [s]) is 1 when the iron core is excited with the sine wave.

Specifically, in the regions in which the magnetic flux density B increases in the hysteresis loop (the regions A, B, C, D, and E in FIG. 6) (see an arrow line 501 in FIG. 5), the very small area HdB is the area of a strip-shaped region surrounded by the hysteresis loop of the region and the vertical axis (the axis of the magnetic flux density B) in a case in which the hysteresis loop is cut in parallel to the horizontal axis (the axis of the field intensity H). At this time, the amount of change dB in the magnetic flux density B per unit time is a positive value. In addition, in the regions in which the magnetic flux density B decreases in the hysteresis loop (the regions E, F, G, H, and I in FIG. 6) (see an arrow line 502 in FIG. 5), the very small area HdB is the area of a strip-shaped region surrounded by the hysteresis loop of the region and the vertical axis (the axis of the magnetic flux density B) in a case in which the hysteresis loop is cut in parallel to the horizontal axis (the axis of the field intensity H). At this time, the amount of change dB in the magnetic flux density B per unit time is a negative value.

Similarly to FIG. 10, the times A to I illustrated in FIG. 11 correspond to the regions A to I illustrated in FIG. 6, respectively. When HdB from the time A to the time I is integrated, the integrated value of the very small region HdB corresponding to one cycle of the hysteresis loop is obtained. Therefore, it is possible to calculate an iron loss value from the integrated value of the very small region HdB at the time I on the basis of Expression (1), using density, a frequency, and the volume of the iron core.

In FIG. 11, a graph 1101 (sine wave) indicates the integrated value of the very small region HdB in a case in which the iron core is excited with the sine wave. A graph 1102 (harmonics (reference example)) indicates the integrated value of the very small region HdB in a case in which the iron core is excited with the harmonics that cause the magnetic flux density B and the field intensity H to be changed as in the hysteresis loop illustrated in FIGS. 2 and 3. A graph 1103 (harmonics (example)) indicates the integrated value of the very small region HdB in a case in which the iron core is excited with the harmonics that cause the magnetic flux density B and the field intensity H to be changed as in the hysteresis loop illustrated in FIGS. 5 to 9.

As illustrated in the graphs 1101 and 1102, in a case in which the iron core is excited with the sine wave and in a case in which the absolute value |Hmin| of the minimum value Hmin of the field intensity H in some minor loops in the region C is less than the absolute value |Hmax| of the maximum value Hmax of the field intensity H in the minor loops (|Hmax|>|Hmin|) (the case illustrated in FIG. 3(b)), the integrated value of the very small region HdB increases in regions other than the region in which a change in the magnetic flux density B is small with respect to a change in the field intensity H. In contrast, as can be seen from the graph 1103, when the absolute value |Hmin| of the minimum value Hmin of the field intensity H in some minor loops in the region C is greater than the absolute value |Hmax| of the maximum value Hmax of the field intensity H in the minor loops (|Hmax|<|Hmin|) (that is, as illustrated in FIG. 7(c)), the integrated value of the very small region HdB decreases for a time period centered on the vicinity of the time C.

The following can be understood from the above.

In at least a portion (portion or all) of the region in which the magnetic flux density B increases in the hysteresis loop, when the PWM inverter is operated such that the absolute value |Hmin| of the minimum value Hmin of the field intensity H in the minor loop is greater than the absolute value |Hmax| of the maximum value Hmax of the field intensity H in the minor loop (|Hmax|<|Hmin|)(that is, as in the example illustrated in FIG. 7(c)), the iron loss of the iron core can be less than that in the case in which the iron core is excited with the sine wave (in the following description, the above-mentioned operation of the PWM inverter is referred to as a first operation as necessary). The first operation may be performed for one or more minor loops in at least a portion of the region in which the magnetic flux density B increases in the hysteresis loop and can reduce the iron loss of the iron core.

In the region in which the magnetic flux density B increases in the hysteresis loop and the region in which the magnetic flux density B decreases in the hysteresis loop, increase and decrease in the magnetic flux density B and the field intensity H are reversed. For example, in the regions F, G, and H illustrated in FIG. 6 (the regions in which the magnetic flux density decreases in the hysteresis loop in the case in which the iron core is excited with the excitation signal excluding the harmonics), a starting point of the minor loop in the hysteresis loop in the case in which the iron core is excited with the excitation signal including the harmonics is an intersection point with the hysteresis loop in the case in which the iron core is excited with the excitation signal excluding the harmonics when the minor loop changes over time in the direction (for example, the left direction in FIG. 9) in which the field intensity H decreases. Therefore, the configuration described with reference to FIGS. 5 to 11 is also applied to the region in which the magnetic flux density B decreases in the hysteresis loop. That is, in at least a portion (portion or all) of the region in which the magnetic flux density B decreases in the hysteresis loop, when the PWM inverter is operated such that the absolute value |Hmax| of the maximum value Hmax of the field intensity H in the minor loop (corresponding to the "second minor loop" in Claim 3) is greater than the absolute value |Hmin| of the minimum value Hmin of the field intensity H in the minor loop (|Hmin|<|Hmax|), the iron loss of the iron core can be less than that in the case in which the iron core is excited with the sine wave (in the following description, the above-mentioned operation of the PWM inverter is referred to as a second operation as necessary). Only one minor loop or a plurality of minor loops corresponding to the "second minor loop" may be present in the region in which the magnetic flux density B decreases in the hysteresis loop.

That is, in the examples illustrated in FIG. 6 (the regions F, G, and H) and FIGS. 8(c) to 9(b), the above-mentioned second operation of the PWM inverter is not achieved. However, the iron loss of the iron core in the case in which the iron core is excited with the excitation signal including the harmonics by the inverter power supply can be less than the iron loss of the iron core in the case in which the iron core is excited with the excitation signal (sine-wave excitation signal) excluding the harmonics by the achievement of the second operation of the PWM inverter.

In the examples illustrated in FIG. 6 (the regions F, G, and H) and FIGS. 8(c) to 9(b), the following relationship is not satisfied: the absolute value [Hmax] of the difference between the maximum value of the field intensity H and the value of the field intensity H at the reference point (the starting point of the minor loop) in each of a plurality of minor loops included in the hysteresis loop in the case in which the iron core is excited with the excitation signal including harmonics by the inverter power supply is greater than the absolute value [Hmin] of the difference from the minimum value of the field intensity H and the value of the field intensity H at the reference point (the starting point of the minor loop) in the minor loop M.

The iron loss of the iron core in the case in which the iron core is excited with the excitation signal including the harmonics by the inverter power supply can also be less than the iron loss of the iron core in the case in which the iron core is excited with the excitation signal (sine-wave excitation signal) excluding the harmonics by the satisfaction of the following relationship: the absolute value [Hmax] of the difference between the maximum value of the field intensity H and the value of the field intensity H at the reference point (the starting point of the minor loop) (corresponding to a "second reference point" in Claim 6) in each of a plurality of minor loops (corresponding to a "fourth minor loop" in Claim 6) included in the hysteresis loop in the case in which the iron core is excited with the excitation signal including the harmonics by the inverter power supply is greater than the absolute value [Hmin] of the difference between the minimum value of the field intensity H and the value of the field intensity H at the reference point (the starting point of the minor loop) in the minor loop M ([Hmin|]<[Hmax]).

Only one minor loop or a plurality of minor loops corresponding to the "fourth minor loop" may be present in at least a portion of the region in which the magnetic flux density B decreases in the hysteresis loop. Further, only one "second reference point" corresponding to one "fourth minor loop" is determined. In a case in which a plurality of "fourth minor loops" are present, the "second reference points" respectively corresponding to the "fourth minor loops" are present. Therefore, only one reference point or a plurality of reference points corresponding to the "second reference point" may be present in at least a portion of the region in which the magnetic flux density B decreases in the hysteresis loop, according to the number of "fourth minor loops". In addition, the relationship of |Hmin|<|Hmax| and the relationship of [Hmin]<[Hmax] may be satisfied in one minor loop at the same time. In this case, the "second minor loop" and the "fourth minor loop" can be the same minor loop.

Further, in the examples illustrated in FIG. 6 (the regions F, G, and H) and FIGS. 8(c) to 9(b) (the examples in which the magnetic flux density of the hysteresis loop decreases), in the minor loops included in the hysteresis loop represented by "HARMONICS (EXAMPLE)", the area of a portion (closed region) that is located inside (on the right side in FIGS. 8(c) to 9(b)) the hysteresis loop represented by "SINE WAVE" in FIGS. 8(c) to 9(b) is not larger than the area of a portion (closed region) that is located outside (on the left side in FIGS. 8(c) to 9(b)) the hysteresis loop.

In the examples in which the magnetic flux density decreases in the hysteresis loop, the iron loss of the iron core in the case in which the iron core is excited with the excitation signal including the harmonics by the inverter power supply can also be less than the iron loss of the iron core in the case in which the iron core is excited with the excitation signal (sine-wave excitation signal) excluding the harmonics by the configuration in which the area of a portion (closed region) that is located inside (on the right side in FIGS. 8(c) to 9(b)) the hysteresis loop represented by "SINE WAVE" in FIGS. 8(c) to 9(b) is larger than the area of a portion (closed region) that is located outside (on the left side in FIGS. 8(c) to 9(b)) the hysteresis loop in the minor loops included in the hysteresis loop represented by "HARMONICS (EXAMPLE)".

Here, in the hysteresis loop, in the regions in which a change in the magnetic flux density B is small with respect to a change in the field intensity H (for example, the regions A, B, D, E, F, H, and I illustrated in FIG. 6), it is difficult for the PWM inverter to perform the first operation and the second operation (it is difficult to satisfy |Hmax|<|Hmin| or |Hmin|<|Hmax|). Therefore, it is preferable to perform the above-mentioned control of the PWM inverter in the regions in which the absolute value of the field intensity H is small and a change in the magnetic flux density B is large with respect to a change in the field intensity H (for example, the regions C and G illustrated in FIG. 6), that is, in the region in which magnetic permeability is high.

Specifically, it is preferable to perform the first operation or the second operation of the PWM inverter in regions (in the example illustrated in FIG. 6, the region C (the region illustrated in FIG. 7(c)) and the region G (the region illustrated in FIG. 9(a))) in which the absolute value of the field intensity H of the iron core is equal to or less than 100 [A/m] in the case in which the iron core is excited with the excitation signal (that is, the sine-wave excitation signal) excluding the harmonics among a plurality of regions (for example, the regions A to I illustrated in FIG. 6) included in the hysteresis loop.

It is preferable to achieve either the first operation or the second operation in all of the regions (in the example illustrated in FIG. 6, the region C (the region illustrated in FIG. 7(c)) and the region G (the region illustrated in FIG. 9(a))) in which the absolute value of the field intensity H is equal to or less than 100 [A/m]. However, either the first operation or the second operation may be achieved in only some of the regions. For example, when there is a region in which the absolute value |Hmin| of the minimum value Hmin of the field intensity H in one or more minor loops is greater than the absolute value |Hmax| of the maximum value Hmax of the field intensity H in the minor loop among some of the regions in which the magnetic flux density increases in the hysteresis loop, the absolute value |Hmin| of the minimum value Hmin of the field intensity H in the minor loop may not be greater than the absolute value |Hmax| of the maximum value Hmax of the field intensity H in the minor loop in some of the other regions.

Figure 12:
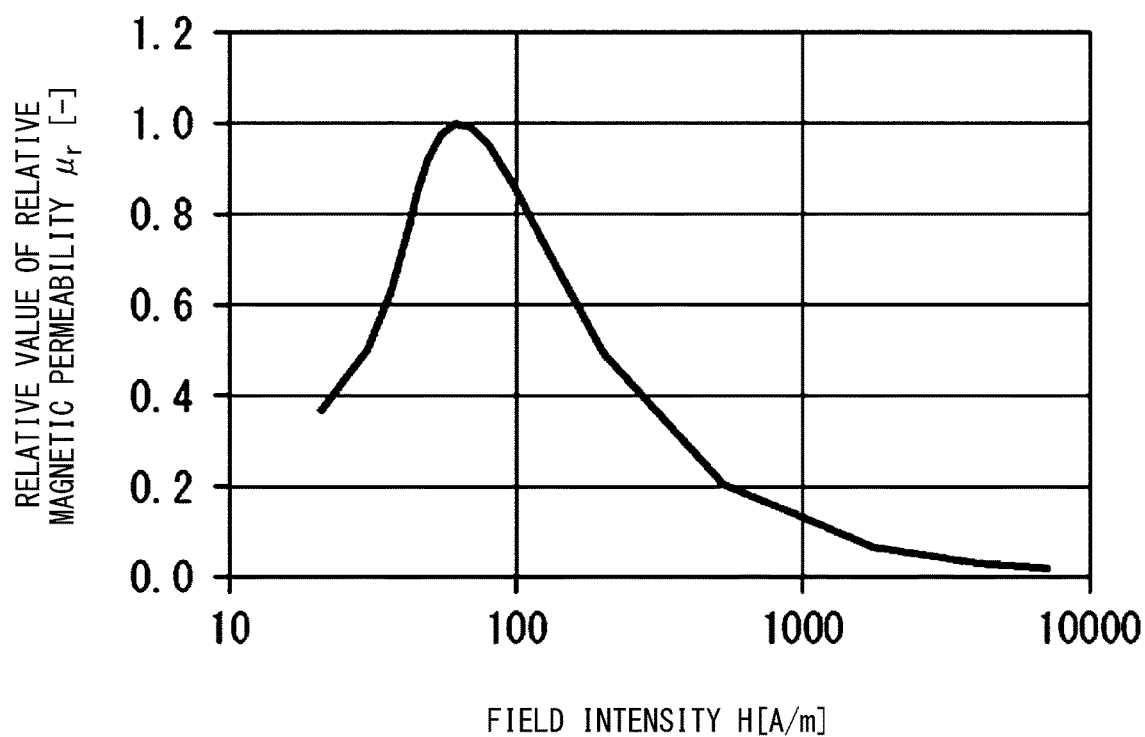
FIG. 12 is a diagram illustrating an example of a relationship between the relative magnetic permeability and field intensity of a soft magnetic plate (electrical steel sheet) forming the iron core.

FIG. 12 is a diagram illustrating an example of the relationship between the relative magnetic permeability $\mu_r$ and the field intensity H of a soft magnetic plate (electrical steel sheet) forming the iron core. Here, the relative magnetic permeability $\mu_r$ on the vertical axis is a relative value in a case in which the maximum value is 1. Further, FIG. 12 illustrates a graph for the soft magnetic plate (electrical steel sheet) forming the iron core used to obtain the results illustrated in FIGS. 2 to 11.

Here, the use of the iron core having a high relative magnetic permeability $\mu_r$ in the region in which the field intensity H is equal to or less than 100 [A/m] facilitates the above-mentioned first and second operations. This will be described below.

A high relative magnetic permeability corresponds to a small skin depth. A small skin depth means a high eddy current density. Since an eddy current is generated in the direction that hinders a change in the magnetic flux, the field intensity H is likely to change so as to hinder the flow of the excitation current (the field intensity H is likely to decrease in the region in which the magnetic flux density B increases in the hysteresis loop and is likely to increase in the region in which the magnetic flux density B decreases in the hysteresis loop). Therefore, the iron core having a high relative magnetic permeability $\mu_r$ facilitates the first operation and the second operation.

As described above, the first operation and the second operation are achieved, for example, by making the modulation factor m and the carrier frequency of the PWM inverter variable.

FIG. 13 is a diagram illustrating an example of the relationship between the carrier frequency, the modulation factor m, and the iron loss ratio. The iron loss ratio is a value obtained by dividing the iron loss of the iron core in a case in which the iron core is excited with the waveform (PWM inverter) of the sine wave on which harmonics are superimposed by the iron loss of the iron core in the case in which the iron core is excited with the sine wave without including the harmonics. In the example illustrated in FIG. 13, in a case in which the modulation factor m is in the range that is equal to or greater than 0.4 and equal to or less than 1.0 and the carrier frequency is in the range that is equal to or greater than 50 [kHz] (equal to or less than 100 [kHz]), the first operation is achieved, and the iron loss of the iron core can be less than the iron loss of the iron core in a case in which the iron core is excited with the sine wave without including harmonics. Further, in a case in which the modulation factor m is 2.0 and the carrier frequency is in the range that is equal to or greater than 5 [kHz] and equal to or less than 15 [kHz], the first operation is achieved, and the iron loss of the iron core can be less than the iron loss of the iron core in the case in which the iron core is excited with the sine wave without including the harmonics. Furthermore, in a case in which the modulation factor m is 2.0 and the carrier frequency is in the range that is equal to or greater than 20 [kHz] (equal to or less than 100 [kHz]), the iron loss of the iron core is equal to the iron loss of the iron core in the case in which the iron core is excited with the sine wave without including the harmonics. In contrast, in a case in which the modulation factor m and the carrier frequency are the other values, the first operation is not achieved, and it is difficult to set the iron loss of the iron core to be less than the iron loss of the iron core in the case in which the iron core is excited with the sine wave without including the harmonics.

Therefore, for example, it is possible to achieve the first operation and the second operation as follows.

First, an electric device and a PWM inverter that are the same as or equivalent to those which are actually used are prepared. Then, the measurement of the hysteresis loop and the iron loss of the iron core when the excitation signal is output from the PWM inverter to the electric device to excite the iron core of the electric device is performed while changing the modulation factor m and the carrier frequency. Further, the iron loss of the iron core when a signal obtained by removing harmonics from the excitation signal output from the PWM inverter is output to the electric device to excite the iron core of the electric device is measured. Instead of the measurement, electromagnetic field analysis (numerical analysis) may be performed.

Then, the modulation factor m and the carrier frequency at which the first operation is achieved are searched. In this case, for example, the hysteresis loop (including the minor loops) is measured or analyzed to obtain the modulation factor m and the carrier frequency, and it is possible to confirm that the first operation is achieved from the hysteresis loop. Similarly, for the second operation, the modulation factor m and the carrier frequency at which the second operation is achieved are searched.

Then, the modulation factor m and the carrier frequency at which the iron loss of the iron core in a case in which the iron core is excited with the excitation signal from the PWM inverter is less than the iron loss of the iron core in a case in which the iron core is excited with a signal obtained by removing harmonics from the excitation signal are selected from the searched modulation factors m and the selected carrier frequencies.

Then, information in which the region of the hysteresis loop for performing the first operation is associated with the modulation factor m and the carrier frequency selected for the first operation is stored as modulation information. Similarly, information in which the region of the hysteresis loop for performing the second operation is associated with the modulation factor m and the carrier frequency selected for the second operation is stored as modulation information. The region of the hysteresis loop for performing the first operation (second operation) in the modulation information is a region (a region defined by the magnetic flux density B and the field intensity H) which is assumed as the region in which the magnetic flux density B increases (decreases) in the hysteresis loop.

At this time, in a case in which the electric device is an electric device that does not perform a steady operation (that is, the excitation conditions are changed), it is preferable to store as many sets of the modulation factors m and the carrier frequencies selected for the first operation as possible. In this case, it is possible to select as many sets of the modulation factors m and the carrier frequencies satisfying an operation command of the electric device as possible. This holds for the modulation factor m and the carrier frequency selected for the second operation.

For example, when the electric device is a motor, the operation command of the electric device includes target values (target ranges) for the operating state of the motor. The target values (target ranges) for the operating state of the motor include a target value (target range) for the rotation speed of the motor and a target value (target range) for torque.

Then, when the iron core of the electric device is excited by the PWM inverter, in a case in which the magnetic flux density B and the field intensity H of the iron core of the electric device are within the region of the hysteresis loop for performing the first operation, the PWM inverter is instructed to operate at the modulation factor m and the carrier frequency that have been stored in association with the region of the hysteresis loop for performing the first operation. Similarly, in a case in which the magnetic flux density B and the field intensity H of the iron core of the electric device are within the region of the hysteresis loop for performing the second operation, the PWM inverter is instructed to operate at the modulation factor m and the carrier frequency that have been stored in association with the region of the hysteresis loop for performing the second operation.

<System for Exciting Iron Core in Electric Device>

Figure 14:
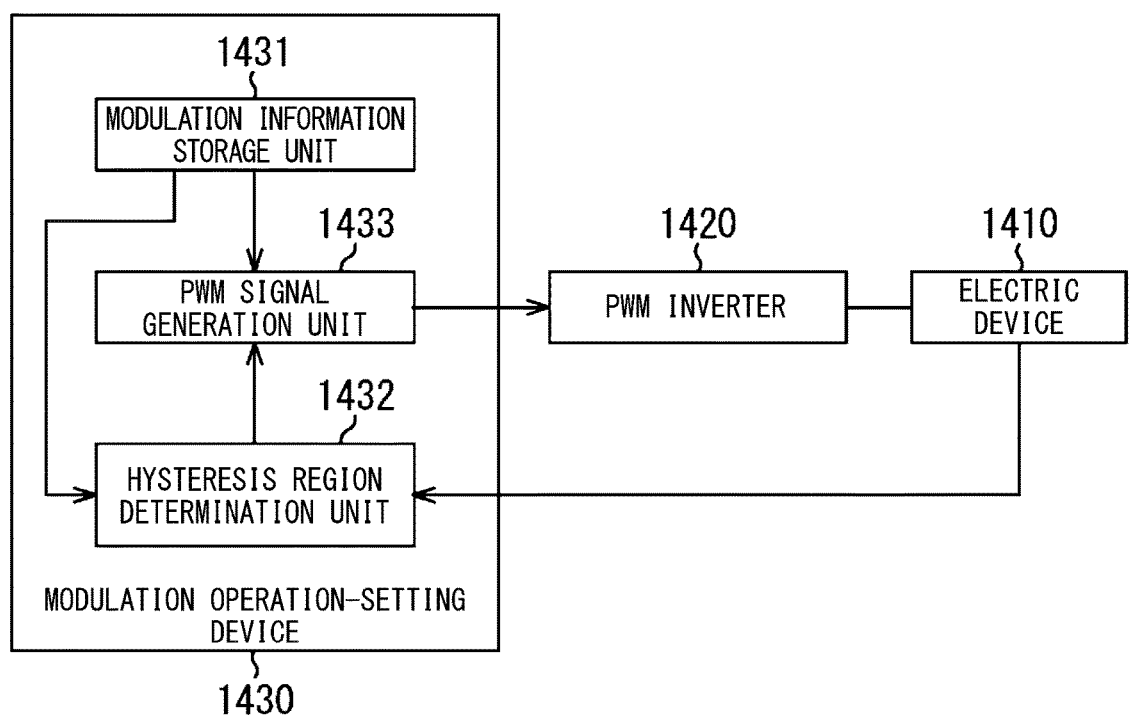
FIG. 14 is a diagram illustrating an example of a configuration of a system for exciting an iron core in an electric device.

FIG. 14 is a diagram illustrating an example of the configuration of a system for exciting an iron core in an electric device. In the following description, the system for exciting an iron core in an electric device will be abbreviated to an excitation system as necessary.

In FIG. 14, the excitation system includes an electric device 1410, a PWM inverter 1420, and a modulation operation-setting device 1430.

The electric device 1410 is not particularly limited as long as it is an electric device having an iron core. For example, a motor, a reactor, or a transformer (a voltage transformer, a current transformer, or a transformer) can be used as the electric device 1410. The electric device may be a single-phase device or a three-phase device. In a three-phase motor, in the case of distributed winding, coils of a plurality of phases are wound around one tooth of a stator core. Therefore, since the magnetic flux in the stator core is complicated, there is a concern that the range of the modulation factor m and the carrier frequency capable of reducing the iron loss of the iron core will not be specified. For this reason, for the three-phase motor, it is preferable to use a three-phase motor of a concentrated winding type as the electric device 1410.

The PWM inverter 1420 is a power supply that excites the iron core of the electric device 1410. In this embodiment, it is assumed that the PWM inverter 1420 can continuously change the amplitude $E_c$ of the carrier wave (the modulation factor m of the PWM inverter) and the carrier frequency.

An example of the function of the modulation operation-setting device 1430 will be described below. The hardware of the modulation operation-setting device 1430 is implemented using, for example, an information-processing device including a CPU, a ROM, a RAM, a HDD, and various interfaces, or a programmable logic controller (PLC). The modulation operation-setting device 1430 functions as a setting unit that sets a modulation operation of the inverter power supply.

The modulation information storage unit 1431 stores modulation information. The modulation information is information in which the region of the hysteresis loop for performing the first operation or the second operation is associated with parameters for determining the modulation operation. In this embodiment, the inverter power supply is controlled by a PWM method. Therefore, the parameters for determining the modulation operation include the modulation factor m and the carrier frequency as described in <Findings>. The method for obtaining the modulation information is as described in <Findings>. Here, it is assumed that the first operation and the second operation are performed in a region in which the absolute value of the field intensity H is equal to or less than 100 [A/m] (specifically, a region in which the absolute value of the field intensity H of the iron core is equal to or less than 100 [A/m] in the case in which the iron core is excited with the excitation signal (that is, the sine-wave excitation signal) excluding the harmonics) in the hysteresis loop.

The hysteresis region determination unit 1432 determines whether or not modulation information corresponding to the current values of the magnetic flux density B and the field intensity H of the iron core of the electric device 1410 is stored in the modulation information storage unit 1431.

Here, for example, a search coil for detecting the magnetic flux of the iron core of the electric device 1410 is provided and the magnetic flux density B of the iron core of the electric device 1410 can be derived from an electromotive force induced in the search coil on the basis of the Faraday's law of electromagnetic induction. In addition, the field intensity H of the iron core of the electric device 1410 can be derived from an excitation current flowing through the electric device 1410 on the basis of the Ampere's law. Further, an H-coil may be provided in the electric device 1410 to measure the field intensity H.

First, the hysteresis region determination unit 1432 determines whether or not the current values of the magnetic flux density B and the field intensity H of the iron core of the electric device 1410 are present in the region of the hysteresis loop for performing the first operation or the region of the hysteresis loop for performing the second operation.

In a case in which the result of the determination shows that the current values of the magnetic flux density B and the field intensity H of the iron core of the electric device 1410 are not present in the region of the hysteresis loop for performing the first operation or the region of the hysteresis loop for performing the second operation, the hysteresis region determination unit 1432 determines that the modulation information corresponding to the current values of the magnetic flux density B and the field intensity H of the iron core of the electric device 1410 has not been stored in the modulation information storage unit 1431 and outputs information indicating the determination result to the PWM signal generation unit 1433.

On the other hand, in a case in which the current values of the magnetic flux density B and the field intensity H of the iron core of the electric device 1410 are present in the region of the hysteresis loop for performing the first operation or the region of the hysteresis loop for performing the second operation, the hysteresis region determination unit 1432 determines in which of the range of the region of the hysteresis loop for performing the first operation and the range of the region of the hysteresis loop or performing the second operation the current values of the magnetic flux density B and the field intensity H of the iron core of the electric device 1410 are present.

In a case in which the current values of the magnetic flux density B and the field intensity H of the iron core of the electric device 1410 are present in the region of the hysteresis loop for performing the first operation, the hysteresis region determination unit 1432 determines whether or not the modulation information including the region of the hysteresis loop for performing the first operation includes the modulation information including the modulation factor m and the carrier frequency satisfying the operation command of the electric device 1410.

When the result of the determination shows that the modulation information including the region of the hysteresis loop for performing the first operation does not include the modulation information including the modulation factor m and the carrier frequency satisfying the operation command of the electric device 1410, the hysteresis region determination unit 1432 determines that the modulation information corresponding to the current values of the magnetic flux density B and the field intensity H of the iron core of the electric device 1410 has not been stored in the modulation information storage unit 1431 and outputs information indicating the determination result to PWM signal generation unit 1433.

On the other hand, when the modulation information including the region of the hysteresis loop for performing the first operation includes the modulation information including the modulation factor m and the carrier frequency satisfying the operation command of the electric device 1410, the hysteresis region determination unit 1432 determines that the modulation information corresponding to the current values of the magnetic flux density B and the field intensity H of the iron core of the electric device 1410 has been stored in the modulation information storage unit 1431. Then, the hysteresis region determination unit 1432 selects one of the modulation information items including the modulation factor m and the carrier frequency satisfying the operation command of the electric device 1410 and outputs information specifying the selected modulation information to the PWM signal generation unit 1433.

The modulation information can be selected according to, for example, a predetermined rule of selecting the modulation information having the smallest modulation factor m.

In a case in which the electric device 1410 is an electric device that performs a steady operation (that is, the excitation conditions are not changed), the hysteresis region determination unit 1432 may not determine whether or not the modulation information including the region of the hysteresis loop for performing the first operation includes the modulation information including the modulation factor m and the carrier frequency satisfying the operation command of the electric device 1410. In this case, the hysteresis region determination unit 1432 selects one of the modulation information items including the region of the hysteresis loop for performing the first operation and outputs information specifying the selected modulation information to the PWM signal generation unit 1433.

In addition, in a case in which the current values of the magnetic flux density B and the field intensity H of the iron core of the electric device 1410 are present in the region of the hysteresis loop for performing the second operation, the hysteresis region determination unit 1432 outputs information specifying the modulation information or information indicating that the modulation information has not been stored in the modulation information storage unit 1431 to the PWM signal generation unit 1433 as in the case in which the current values of the magnetic flux density B and the field intensity H of the iron core of the electric device 1410 are present in the region of the hysteresis loop for performing the first operation.

When the hysteresis region determination unit 1432 outputs the information specifying the modulation information corresponding to the current values of the magnetic flux density B and the field intensity H of the iron core of the electric device 1410, the PWM signal generation unit 1433 reads the parameters (the modulation factor m and the carrier frequency) for determining the modulation operation included in the modulation information from the modulation information storage unit 1431. Then, the PWM signal generation unit 1433 generates a PWM signal including information required to generate the fundamental wave and the carrier wave and outputs the PWM signal to the PWM inverter 1420. The information can include parameters, such as the amplitude $E_c$ of the carrier wave, the carrier frequency, and the frequency of the fundamental wave, that can be changed when the PWM inverter 1420 generates the fundamental wave and the carrier wave.

On the other hand, when the hysteresis region determination unit 1432 outputs the information indicating that the modulation information corresponding to the current values of the magnetic flux density B and the field intensity H of the iron core of the electric device 1410 has not been stored in the modulation information storage unit 1431, the PWM signal generation unit 1433 adopts values that do not contribute to reducing the iron loss (by adjusting the relationship between the maximum value Hmax and the minimum value Hmin of the field intensity H in the minor loop for reducing the iron loss) as the parameters (the modulation factor m and the carrier frequency) for determining the modulation operation. Then, the PWM signal generation unit 1433 generates a PWM signal including information required to generate the fundamental wave and the carrier wave on the basis of the adopted values and outputs the PWM signal to the PWM inverter 1420.

As the values of the parameters for determining the modulation operation at this time, for example, the parameters (the modulation factor m and the carrier frequency) for determining the modulation operation when the first operation or the second operation is performed can be used. Even when the parameters are set, it is difficult to perform the first operation or the second operation in the region in which a change in the magnetic flux density B is small with respect to a change in the field intensity H. That is, even when the parameters are set, they do not contribute to reducing the iron loss (by adjusting the relationship between the maximum value Hmax and the minimum value Hmin of the field intensity H in the minor loop for reducing the iron loss).

However, the iron loss of the iron core can also be less than that in a case in which the iron core is excited with the sine wave on which harmonics are not superimposed (see the graphs 1101 and 1103 in FIG. 11) by continuously performing the operation of the PWM inverter using the parameters for determining the modulation operation when the first operation or the second operation is performed for one cycle of the hysteresis loop, as described in <Findings>. Therefore, this makes it possible to more reliably reduce the loss of the iron core. However, this may not be necessarily performed, and the parameters (the modulation factor m and the carrier frequency) for determining the modulation operation may be set so as to return to the operation of the existing PWM inverter.

The PWM inverter 1420 performs a modulation operation based on the PWM method on the basis of the PWM signal output from the PWM signal generation unit 1433 to excite the iron core in the electric device 1410.

<Operation Flowchart>

Figure 15:
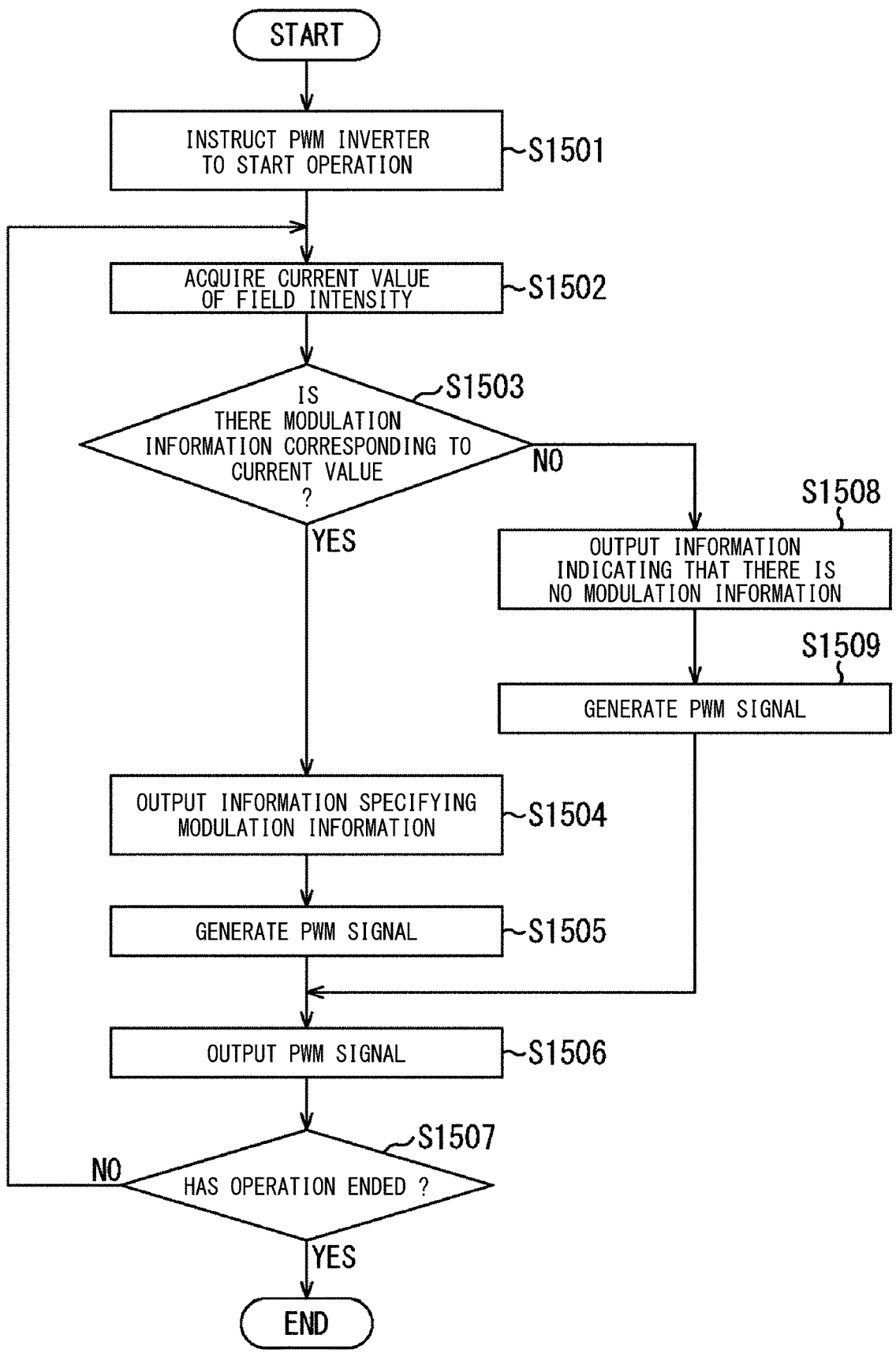
FIG. 15 is a flowchart illustrating an example of an operation of the system for exciting an iron core in an electric device.

Next, an example of the operation of a driving system according to this embodiment will be described with reference to a flowchart illustrated in FIG. 15.

First, in Step S1501, when the start of the operation of the electric device 1410 is instructed, the PWM signal generation unit 1433 outputs a PWM signal including information required to generate the fundamental wave and the carrier wave to the PWM inverter 1420 to instruct the start of the operation of the electric device 1410. The parameters (the modulation factor m and the carrier frequency) for determining the modulation operation which are output at this time are not particularly limited. For example, the parameters (the modulation factor m and the carrier frequency) for determining the modulation operation which are output at this time may be values that are predetermined as the values when the operation starts.

Next, in Step S1502, the hysteresis region determination unit 1432 acquires (derives) the current values of the magnetic flux density B and the field intensity H of the iron core of the electric device 1410.

Next, in Step S1503, the hysteresis region determination unit 1432 determines whether or not modulation information corresponding to the current values of the magnetic flux density B and the field intensity H of the iron core of the electric device 1410 acquired in Step S1502 has been stored in the modulation information storage unit 1431. In a case in which the result of the determination shows that the modulation information corresponding to the current values of the magnetic flux density B and the field intensity H of the iron core of the electric device 1410 has been stored in the modulation information storage unit 1431, the process proceeds to Step S1504.

When the process proceeds to Step S1504, the hysteresis region determination unit 1432 outputs information specifying the modulation information corresponding to the current values of magnetic flux density B and the field intensity H of the iron core of electric device 1410 to the PWM signal generation unit 1433. In a case in which the electric device 1410 is an electric device that does not perform the steady operation (that is, the excitation conditions are changed), modulation information that includes the modulation factor m and the carrier frequency satisfying the operation command of the electric device 1410 is specified and then output to the PWM signal generation unit 1433.

Next, in Step S1504, the PWM signal generation unit 1433 reads, from the modulation information storage unit 1431, the parameters (the modulation factor m and the carrier frequency) for determining the modulation operation included in the modulation information specified by the information output in Step S1504. Then, the PWM signal generation unit 1433 generates a PWM signal including the information required to generate the fundamental wave and the carrier wave, on the basis of the read parameters (the modulation factor m and the carrier frequency) for determining the modulation operation and the information of the fundamental wave input from the outside.

Next, in Step S1506, the PWM signal generation unit 1433 outputs the PWM signal to the PWM inverter 1420. The PWM inverter 1420 performs the modulation operation based on the PWM method on the basis of the PWM signal to excite the iron core in the electric device 1410.

Next, in Step S1507, the modulation operation-setting device 1430 determines whether or not to end the operation of the electric device 1410. For example, this determination can be implemented by whether or not the operator has performed an operation for ending the operation of the electric device 1410 on a user interface of the modulation operation-setting device 1430.

In a case in which the result of the determination shows that the operation of the electric device 1410 is not ended, the process returns to Step S1502 and the excitation of the iron core in the electric device 1410 is continued. Then, in Step S1507, when it is determined that the operation of the electric device 1410 is ended, the process in the flowchart illustrated FIG. 15 ends.

When it is determined in Step S1503 that the modulation information corresponding to the current values of the magnetic flux density B and the field intensity H of the iron core of the electric device 1410 acquired in Step S1502 has not been stored in the modulation information storage unit 1431, the process proceeds to Step S1508. When the process proceeds to Step S1508, the hysteresis region determination unit 1432 outputs information indicating that there is no modulation information corresponding to the current values of the magnetic flux density B and the field intensity H of the iron core of the electric device 1410 to the PWM signal generation unit 1433.

Then, in Step S1509, the PWM signal generation unit 1433 sets the parameters (the modulation factor m and the carrier frequency) for determining the modulation operation to values that do not contribute to reducing the iron loss (by adjusting the relationship with the maximum value Hmax and the minimum value Hmin of the field intensity H in the minor loop for reducing the iron loss). Then, the PWM signal generation unit 1433 generates a PWM signal including information required to generate the fundamental wave and the carrier wave. Then, the process proceeds to Step S1506 and the PWM signal generation unit 1433 outputs the PWM signal to the PWM inverter 1420.

SUMMARY

As described above, in this embodiment, the modulation operation-setting device 1430 adjusts the relationship between the maximum value Hmax and the minimum value Hmin of the field intensity in the minor loop of the hysteresis loop to set the modulation operation of the PWM inverter 1420 such that the iron loss of the iron core is less than the iron loss of the iron core in a case in which the iron core of the electric device is excited with a signal obtained by removing harmonics from the excitation signal including the harmonics. Specifically, the modulation operation-setting device 1430 operates the PWM inverter 1420 such that the absolute value |Hmin| of the minimum value Hmin of the field intensity H in some minor loops is greater (less) than the absolute value |Hmax| of the maximum value Hmax of the field intensity H in the minor loops in a portion of the region in which the magnetic flux density B increases (decreases) in the hysteresis loop. Therefore, it is possible to reduce the iron loss of the iron core excited by the inverter power supply.

MODIFICATION EXAMPLES

First Modification Example

In this embodiment, the case in which both the first operation and the second operation are performed has been described as an example. However, only the first operation or only the second operation may be performed. In this case, when the electric device is an electric device that performs the steady operation (that is, the excitation conditions are not changed), the hysteresis region determination unit 1432 is not necessarily required. That is, in a case in which only the first operation is performed, the modulation factor m and the carrier frequency for the first operation can be continuously selected. Similarly, in a case in which only the second operation is performed, the modulation factor m and the carrier frequency selected for the second operation can be continuously selected. Further, modulation information including other parameters for determining the modulation operation (for example, the amplitude of the carrier wave or the amplitude of the fundamental wave) in addition to the modulation factor m and the carrier frequency may be calculated in order to more reliably reduce the iron loss.

Second Modification Example

Further, the first operation and the second operation may not be necessarily performed when the relationship between the maximum value Hmax and the minimum value Hmin of the field intensity H in the minor loop is adjusted such that the iron loss of the iron core is less than the iron loss of the iron core in a case in which the iron core is excited with a signal obtained by removing harmonic components from the excitation signal output from the PWM inverter 1420 (that is, the area of the hysteresis loop is reduced without changing the maximum value of the magnetic flux density B). The reason is as follows. In FIG. 11, even though the integrated value of the very small region HdB is not reduced, it is possible to reduce the iron loss of the iron core when the rate of increase (the amount of increase per unit time) in the integrated value of the very small region HdB is less than the integrated value (graph 1101) of the very small region HdB in a case in which the iron core is excited with the sine wave.

Third Modification Example

In this embodiment, the case in which only the reduction of the iron loss of the iron core is considered has been described as an example. For example, in some cases, it is necessary to suppress the generation of heat from the iron core more than other portions. For example, it is necessary to suppress that the operation of the electric device 1410 is not guaranteed due to an increase in temperature caused by the generation of heat from the iron core. In this case, a reduction in the iron loss of the iron core has priority over a reduction in the loss of other portions.

The main loss of the electric device 1410 includes copper loss in addition to the iron loss. The copper loss can be reduced by increasing a coil arrangement space in the electric device 1410 to reduce the current density of the coil (increasing the cross-sectional area of the coil), thereby reducing the direct-current resistance of the coil. Further, the main loss of the inverter power supply is switching loss. The switching loss can be reduced by, for example, synchronizing a plurality of inverter power supplies such that they are operated in parallel to reduce a current flowing through each switching element.

However, in some cases, the proportion of the copper loss or the switching loss to the total loss of the electric device 1410 may be higher than the proportion of the iron loss. In this case, even when the modulation operation is determined in order to reduce only the iron loss, the efficiency of the electric device may not be improved. Therefore, instead of calculating the modulation information (the parameters for determining the modulation operation) such that the iron loss of the iron core is less than the iron loss of the iron core in a case in which the iron core of the electric device is excited with the signal obtained by removing harmonics from the excitation signal including the harmonics, the modulation information (the parameters for determining the modulation operation) may be calculated such that the loss of the entire excitation system (the sum of the loss (mainly the iron loss and the copper loss) of the electric device 1410 and the loss (mainly the switching loss) of the PWM inverter 1420) is reduced.

Fourth Modification Example

In this embodiment, the case in which the PWM inverter is used as the inverter power supply has been described as an example. However, the inverter power supply is not limited to one having the PWM inverter. The parameters (the modulation factor m and the carrier frequency in this embodiment) for determining the modulation operation of the inverter power supply are determined on the basis of the modulation method of the inverter power supply. For example, in a case in which a pulse amplitude modulation (PAM) inverter is used, the ratio of a direct-current voltage supplied to an inverter unit to an output voltage to a motor is included in the parameters for determining the modulation operation.

Other Modification Examples

A computer may execute a program to implement the above-described embodiment of the invention. In addition, a computer-readable recording medium having the program recorded thereon and a computer program product, such as the program, can be applied as the embodiment of the invention. For example, a flexible disk, a hard disk drive, an optical disk, a magneto-optical disk, a CD-ROM, a magnetic tape, a non-volatile memory card, and a ROM can be used as the recording medium.

In addition, all of the above-described embodiments of the invention are merely examples of the embodiments for carrying out the invention, and the technical scope of the invention should not be construed as being limited by the embodiments. That is, the invention can be implemented in various forms without departing from the technical idea or the main features of the invention.

BRIEF DESCRIPTION OF THE REFERENCE SYMBOLS

1410: electric device
1420: PWM inverter
1430: modulation operation-setting device
1431: modulation information storage unit
1432: hysteresis region determination unit
1433: PWM signal generation unit

What is claimed is:

1. A system for exciting an iron core in an electric device, the system comprising:
    the electric device having the iron core;
    an inverter power supply configured to output an excitation signal including harmonics to the electric device in order to excite the iron core; and
    a modulation operation-setting device configured to set a modulation operation of the inverter power supply,
    wherein the modulation operation-setting device has a function of a setting unit configured to set the modulation operation of the inverter power supply on the basis of a relationship between a maximum value and a minimum value of a field intensity in at least one minor loop of a hysteresis loop indicating a relationship between a magnetic flux density and the field intensity of the iron core, and
    the relationship between the maximum value and the minimum value of the field intensity is adjusted such that an iron loss of the iron core in a case in which the iron core is excited with the excitation signal including the harmonics by the inverter power supply is less than an iron loss of the iron core in a case in which the iron core is excited with an excitation signal excluding the harmonics.

2. The system for exciting an iron core in an electric device according to claim 1,
    wherein the setting unit sets the modulation operation of the inverter power supply such that, in at least a portion of a region in which the magnetic flux density increases in the hysteresis loop in the case in which the iron core is excited with the excitation signal excluding the harmonics, as a relationship between a maximum value and a minimum value of the field intensity in a first minor loop which is one of minor loops of the hysteresis loop in the case in which the iron core is excited with the excitation signal including the harmonics, a relationship is obtained in which an absolute value of the minimum value of the field intensity is greater than an absolute value of the maximum value of the field intensity in the first minor loop.

3. The system for exciting an iron core in an electric device according to claim 1,
wherein the setting unit sets the modulation operation of the inverter power supply such that, in at least a portion of a region in which the magnetic flux density decreases in the hysteresis loop in the case in which the iron core is excited with the excitation signal excluding the harmonics, as a relationship between a maximum value and a minimum value of the field intensity in a second minor loop which is one of minor loops of the hysteresis loop in the case in which the iron core is excited with the excitation signal including the harmonics, a relationship is obtained in which an absolute value of the maximum value of the field intensity is greater than an absolute value of the minimum value of the field intensity in the second minor loop.

4. The system for exciting an iron core in an electric device according to claim 1,
wherein the setting unit sets the modulation operation of the inverter power supply such that the relationship between the maximum value and the minimum value of the field intensity is obtained in a region in which an absolute value of the field intensity of the iron core is equal to or less than 100 [A/m] in the case in which the iron core is excited with the excitation signal excluding the harmonics, among a plurality of regions included in the hysteresis loop.

5. The system for exciting an iron core in an electric device according to claim 1,
wherein the setting unit sets the modulation operation of the inverter power supply such that, in at least a portion of a region in which the magnetic flux density increases in the hysteresis loop in the case in which the iron core is excited with the excitation signal excluding the harmonics, as the relationship between the maximum value and the minimum value of the field intensity in the minor loop of the hysteresis loop in the case in which the iron core is excited with the excitation signal including the harmonics, a relationship is obtained in which an absolute value of a difference between a minimum value of the field intensity in a third minor loop, which is one of minor loops of the hysteresis loops in the case in which the iron core is excited with the excitation signal including the harmonics, and a value of the field intensity at a first reference point, which is one of intersection points between the third minor loop and the hysteresis loop in the case in which the iron core is excited with the excitation signal excluding the harmonics, is greater than an absolute value of a difference between a maximum value of the field intensity in the third minor loop and the value of the field intensity at the first reference point.

6. The system for exciting an iron core in an electric device according to claim 1,
wherein the setting unit sets the modulation operation of the inverter power supply such that, in at least a portion of a region in which the magnetic flux density decreases in the hysteresis loop in the case in which the iron core is excited with the excitation signal excluding the harmonics, as the relationship between the maximum value and the minimum value of the field intensity in the minor loop of the hysteresis loop in the case in which the iron core is excited with the excitation signal including the harmonics, a relationship is obtained in which an absolute value of a difference between a maximum value of the field intensity in a fourth minor loop, which is one of minor loops of the hysteresis loop in the case in which the iron core is excited with the excitation signal including the harmonics, and a value of the field intensity at a second reference point, which is one of intersection points between the fourth minor loop and the hysteresis loop in the case in which the iron core is excited with the excitation signal excluding the harmonics, is greater than an absolute value of a difference between a minimum value of the field intensity in the fourth minor loop and the value of the field intensity at the second reference point.

7. A system for exciting an iron core in an electric device, the system comprising:
the electric device having the iron core;
an inverter power supply configured to output an excitation signal including harmonics to the electric device in order to excite the iron core; and
a modulation operation-setting device configured to set a modulation operation of the inverter power supply,
wherein the modulation operation-setting device sets the modulation operation of the inverter power supply on the basis of a relationship between areas of closed regions formed by at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and
the relationship is adjusted such that an iron loss of the iron core in the case in which the iron core is excited with the excitation signal including the harmonics by the inverter power supply is less than an iron loss of the iron core in the case in which the iron core is excited with the excitation signal excluding the harmonics.

8. A system for exciting an iron core in an electric device, the system comprising:
the electric device having the iron core;
an inverter power supply configured to output an excitation signal including harmonics to the electric device in order to excite the iron core; and
a modulation operation-setting device configured to set a modulation operation of the inverter power supply,
wherein the modulation operation-setting device sets the modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and
the relationship is adjusted such that, in at least a portion of a region in which the magnetic flux density increases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics.

9. A system for exciting an iron core in an electric device, the system comprising:
the electric device having the iron core;
an inverter power supply configured to output an excitation signal including harmonics to the electric device in order to excite the iron core; and
a modulation operation-setting device configured to set a modulation operation of the inverter power supply,
wherein the modulation operation-setting device sets the modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply, and a hysteresis loop of a field intensity and a magnetic flux density generated in the iron core in a case in which the iron core is excited with an excitation signal excluding the harmonics, and
the relationship is adjusted such that, in at least a portion of a region in which the magnetic flux density decreases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics.

10. The system for exciting an iron core in an electric device according to claim 7,
wherein the modulation operation-setting device sets the modulation operation of the inverter power supply such that the relationship between the maximum value and the minimum value of the field intensity is obtained in a region in which an absolute value of the field intensity of the iron core is equal to or less than 100 [A/m] in the case in which the iron core is excited with the excitation signal excluding the harmonics, among a plurality of regions included in the hysteresis loop.

11. The system for exciting an iron core in an electric device according to claim 1,
wherein the inverter power supply has a pulse width modulation (PWM) inverter, and
the setting unit or the modulation operation-setting device sets a modulation factor and a frequency of a carrier wave to set the modulation operation of the inverter power supply.

12. A method for exciting an iron core in an electric device for an inverter power supply configured to output an excitation signal including harmonics to the electric device in order to excite the iron core of the electric device, the method comprising:
a setting step of setting a modulation operation of the inverter power supply on the basis of a relationship between a maximum value and a minimum value of a field intensity in at least one minor loop of a hysteresis loop indicating a relationship between a magnetic flux density and the field intensity of the iron core,
wherein the relationship between the maximum value and the minimum value of the field intensity is adjusted such that an iron loss of the iron core in a case in which the iron core is excited with the excitation signal including the harmonics by the inverter power supply is less than an iron loss of the iron core in a case in which the iron core is excited with an excitation signal excluding the harmonics.

13. A method for exciting an iron core in an electric device for an inverter power supply configured to output an excitation signal including harmonics to the electric device in order to excite the iron core of the electric device, the method comprising:
setting a modulation operation of the inverter power supply on the basis of a relationship between areas of closed regions formed by at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics,
wherein the relationship is adjusted such that an iron loss of the iron core in the case in which the iron core is excited with the excitation signal including the harmonics by the inverter power supply is less than an iron loss of the iron core in the case in which the iron core is excited with the excitation signal excluding the harmonics.

14. A method for exciting an iron core in an electric device for an inverter power supply configured to output an excitation signal including harmonics to the electric device in order to excite the iron core of the electric device, the method comprising:
- a setting step of setting a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics,
- wherein the relationship is adjusted such that, in at least a portion of a region in which the magnetic flux density increases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics.

15. A method for exciting an iron core in an electric device for an inverter power supply configured to output an excitation signal including harmonics to the electric device in order to excite the iron core of the electric device, the method comprising:
- a setting step of setting a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics,
- wherein the relationship is adjusted such that, in at least a portion of a region in which the magnetic flux density decreases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, an area of a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics is larger than an area of a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics.

16. A program configured to cause a computer to function as each unit of the system for exciting an iron core in an electric device according to claim 1.

17. A modulation operation-setting device for an inverter power supply configured to output an excitation signal including harmonics to an electric device in order to excite an iron core of the electric device,
- wherein the modulation operation-setting device for the inverter power supply sets a modulation operation of the inverter power supply on the basis of a relationship between a maximum value and a minimum value of a field intensity in at least one minor loop of a hysteresis loop indicating a relationship between a magnetic flux density and the field intensity of the iron core, and
- the relationship between the maximum value and the minimum value of the field intensity is adjusted such that an iron loss of the iron core in a case in which the iron core is excited with the excitation signal including the harmonics by the inverter power supply is less than an iron loss of the iron core in a case in which the iron core is excited with an excitation signal excluding the harmonics.

18. A modulation operation-setting device for an inverter power supply configured to output an excitation signal including harmonics to an electric device in order to excite an iron core of the electric device,
- wherein the modulation operation-setting device for the inverter power supply sets a modulation operation of the inverter power supply on the basis of a relationship between areas of closed regions formed by at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and
- the relationship is adjusted such that an iron loss of the iron core in the case in which the iron core is excited with the excitation signal including the harmonics by the inverter power supply is less than an iron loss of the iron core in the case in which the iron core is excited with the excitation signal excluding the harmonics.

19. A modulation operation-setting device for an inverter power supply configured to output an excitation signal including harmonics to an electric device in order to excite an iron core of the electric device,
- wherein the modulation operation-setting device for the inverter power supply sets a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that, in at least portion of a region in which the magnetic flux density increases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics has a larger area than a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics.

20. A modulation operation-setting device for an inverter power supply configured to output an excitation signal including harmonics to an electric device in order to excite an iron core of the electric device, wherein the modulation operation-setting device for the inverter power supply sets a modulation operation of the inverter power supply on the basis of a relationship between at least one minor loop of a hysteresis loop of a field intensity and a magnetic flux density generated in the iron core in a case in which the iron core is excited with the excitation signal including the harmonics by the inverter power supply and a hysteresis loop of a field intensity and a magnetic flux density generated in the iron core in a case in which the iron core is excited with an excitation signal excluding the harmonics, and the relationship is adjusted such that, in at least a portion of a region in which the magnetic flux density decreases in the hysteresis loop in the case in which the iron core is excited with the excitation signal excluding the harmonics, in at least one of a plurality of minor loops included in the hysteresis loop in the case in which the iron core is excited with the excitation signal including the harmonics by the inverter power supply, a closed region formed by a portion that is located on a side where the field intensity is high with respect to the hysteresis loop in the case in which the iron core is excited with the excitation signal excluding the harmonics and the hysteresis loop in the case in which the iron core is excited with the excitation signal excluding the harmonics has a larger area than a closed region formed by a portion that is located on a side where the field intensity is low with respect to the hysteresis loop in the case in which the iron core is excited with the excitation signal excluding the harmonics and the hysteresis loop in the case in which the iron core is excited with the excitation signal excluding the harmonics, and an iron loss of the iron core in the case in which the iron core is excited with the excitation signal including the harmonics by the inverter power supply is less than an iron loss of the iron core in the case in which the iron core is excited with the excitation signal excluding the harmonics.

* * * * *